United States Patent
Rietmann et al.

(10) Patent No.: US 10,508,207 B2
(45) Date of Patent: *Dec. 17, 2019

(54) COMPOSITIONS INCLUDING A HIGH MOLECULAR WEIGHT ACID SUITABLE FOR CONDUCTIVE POLYMER FORMATION ON DIELECTRIC SUBSTRATE

(71) Applicant: MacDermid Enthone Inc., Waterbury, CT (US)

(72) Inventors: Christian Rietmann, Langenfeld (DE); Andreas Glöckner, Langenfeld (DE)

(73) Assignee: MacDermid Enthone Inc., Waterbury, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/545,208

(22) PCT Filed: Jan. 20, 2016

(86) PCT No.: PCT/IB2016/050277
§ 371 (c)(1),
(2) Date: Jul. 20, 2017

(87) PCT Pub. No.: WO2016/116876
PCT Pub. Date: Jul. 28, 2016

(65) Prior Publication Data
US 2018/0002541 A1  Jan. 4, 2018
US 2019/0177556 A9  Jun. 13, 2019

Related U.S. Application Data
(63) Continuation-in-part of application No. 13/882,330, filed as application No. PCT/US2011/058628 on Oct. 31, 2011, now Pat. No. 10,021,782.
(Continued)

(51) Int. Cl.
*C09D 5/44* (2006.01)
*C25D 5/56* (2006.01)
(Continued)

(52) U.S. Cl.
CPC ............... *C09D 5/44* (2013.01); *C25D 5/56* (2013.01); *H05K 3/423* (2013.01); *H05K 3/426* (2013.01);
(Continued)

(58) Field of Classification Search
CPC .......... C09D 5/44; H05K 3/423; H05K 3/426; H05K 2201/0329; C25D 3/38
See application file for complete search history.

(56) References Cited

U.S. PATENT DOCUMENTS
2014/0138253 A1   5/2014   Rasmussen et al.

FOREIGN PATENT DOCUMENTS
EP   2447296   5/2012
JP   2013-543908 A5   12/2014
(Continued)

OTHER PUBLICATIONS

Versa Product documentation (Year: 2009).*

*Primary Examiner* — Louis J Rufo
(74) *Attorney, Agent, or Firm* — Carmody Torrance Sandak & Hennessey LLP

(57) ABSTRACT

The invention relates to a composition and a process for the deposition of conductive polymers on dielectric substrates. In particular, the invention relates to a composition for the formation of electrically conductive polymers on the surface of a dielectric substrate, the composition comprising at least one polymerizable monomer which is capable to form a conductive polymer, an emulsifier and an acid, characterized in that the composition comprises at least one metal-ion selected from the group consisting of lithium-ions, sodium-
(Continued)

ions, aluminum-ions, beryllium-ions, bismuth-ions, boron-ions, indium-ions and alkyl imidazolium-ions. The acid is typically a high molecular weight polymeric acid having molecular weight of at least 500,000 Da including, for example, polystyrene sulfonic acid having a molecular weight of approximately 1,000,000 Da.

23 Claims, 6 Drawing Sheets

Related U.S. Application Data

(60) Provisional application No. 62/105,631, filed on Jan. 20, 2015.

(51) Int. Cl.
*H05K 3/42* (2006.01)
*C25D 3/38* (2006.01)
*C25D 5/02* (2006.01)

(52) U.S. Cl.
CPC ............... *C25D 3/38* (2013.01); *C25D 5/02* (2013.01); *H05K 2201/0329* (2013.01)

(56) References Cited

FOREIGN PATENT DOCUMENTS

| | | | | |
|---|---|---|---|---|
| KR | 10-2014-0000258 | 1/2014 | | |
| WO | 2012/058681 A2 | 5/2012 | | |
| WO | WO-2012058681 A2 * | 5/2012 | ........... | C08G 61/126 |

\* cited by examiner

COMPOSITIONS INCLUDING A HIGH MOLECULAR WEIGHT ACID SUITABLE FOR CONDUCTIVE POLYMER FORMATION ON DIELECTRIC SUBSTRATE

FIELD OF THE INVENTION

The invention relates to a composition and a process for the deposition of conductive polymers on dielectric substrates. In particular, the invention relates to a composition for the formation of electrically conductive polymers on the surface of a dielectric substrate, the composition comprising at least one polymerizable monomer which is capable to form a conductive polymer, an emulsifier and an acid, characterized in that the composition comprises at least one metal-ion selected from the group consisting of lithium-ions, sodium-ions, aluminum-ions, beryllium-ions, bismuth-ions, boron-ions, indium-ions and alkyl imidazolium-ions. The acid is typically a high molecular weight polymeric acid having molecular weight of at least 500,000 Da including, for example, polystyrene sulfonic acid having a molecular weight of approximately 1,000,000 Da.

BACKGROUND OF THE INVENTION

The invention relates to a composition and a method for the deposition of conductive polymers on dielectric substrates. In particular, the invention relates to a composition and a method used in a process for metalizing the surface of a dielectric substrate as well as to metalize the surface of drilled through holes and microvias in dielectric substrates commonly used in the manufacturing of printed circuit boards (PCB).

The use of electrically conductive polymers in the metallization of a dielectric polymeric resin substrate was disclosed by Hupe et al. (U.S. Pat. No. 5,194,313) for the metallization of epoxy resin substrates in PCB manufacture. The method described therein involved the oxidation of exposed surfaces of the polymeric resin substrate with an oxidizing agent, such as permanganate, followed by deposition of a conductive polymer from a catalyst solution comprising a polymerizable heterocyclic aromatic molecule and an acid. Exemplary heterocyclic aromatic molecules in the catalyst composition were pyrrole, furan, and thiophene. The heterocyclic aromatic molecules polymerize over the oxidized exposed surfaces of the polymeric resin substrate, and the deposited polypyrrole, polyfuran, or polythiophene rendered the exposed surfaces of the epoxy resin substrate electrically conductive. The conductivity achieved by the conductive polymers could be used for electrolytic copper plating on dielectric surfaces. For example, the process was used to render electrically conductive the exposed side walls of drilled through holes in a copper clad laminate for subsequent copper plating. Advantageously, the oxidation step was selective for the exposed areas of epoxy resin, i.e., the sidewalls of the drilled through holes, and did not render copper laminate catalytic to polymerization.

Jonas et al. (U.S. Pat. No. 5,403,467) disclosed poly(3,4-ethylenedioxythiophene) (PEDOT), a specific conductive polymer for use in rendering polymeric resin substrates amenable to electrolytic copper plating. As currently practiced, metallization of through holes and microvias in plastic substrates involves several steps: Drilling, conditioning, rinsing, oxidizing, rinsing, catalyzing, rinsing, and plating. Alternatively to PEDOT, polyaniline (PAni) can be used to render the dielectric surfaces electrically conductive for subsequent electrolytic metal plating.

In EP 1 897 974 A a process for the metallization of a surface of a dielectric substrate with electrolytically plated copper is disclosed using conductive polymers to form a first conductive layer on the substrate surface, like e.g. the inside surface of through-holes in PWBs.

Rietmann et al. WO 2012/058681 disclosed an improvement on the aforementioned processes based on their discovery that incorporation of ions based on lithium, sodium, aluminum, beryllium, boron, indium, or alkyl imidazolium reduces the tendency of the polymerizable monomers to form significant quantities of non-conductive oligomers.

SUMMARY OF THE INVENTION

Among other aspects it is an object of the invention to provide an improved composition and method for the deposition of conductive polymers on dielectric substrates in a process of metallization of dielectric surfaces, which has an increased lifetime and stability. It is also an object to provide such composition and method which manifest improvements in lateral copper growth (LCG) characteristics, improvements in deposition speed, and reduced make-up requirements; and which are effective for both high-Cu and low-Cu systems. Furthermore, it is an aspect of the invention to provide an improved process for metallization of a surface of a dielectric substrate by electrolytic deposition of a metal.

Briefly, therefore, the invention is directed to a composition for the formation of electrically conductive polymers on the surface of a dielectric substrate, the composition comprising at least one polymerizable monomer which is capable to form a conductive polymer, an emulsifier and an acid, characterized in that the composition comprises at least one metallic or nitrogenous ion selected from the group consisting of lithium-ions, sodium-ions, aluminum-ions, beryllium-ions, bismuth-ions, BxOy-anions, indium-ions, and alkylimidazolium-ion, wherein the acid is a polymeric acid having a molecular weight of at least 500,000 Da.

The present invention is also directed to methods for metalizing a surface of a dieletric substrate by deposition of a metal. The methods generally comprise immersing the substrate into a composition according to the present invention to form an electrically conductive polymer on the surface of the dielectric substrate; and depositing a metal over said electrically conductive polymer.

DETAILED DESCRIPTION OF THE PREFERRED EMBODIMENTS

Figure 1:
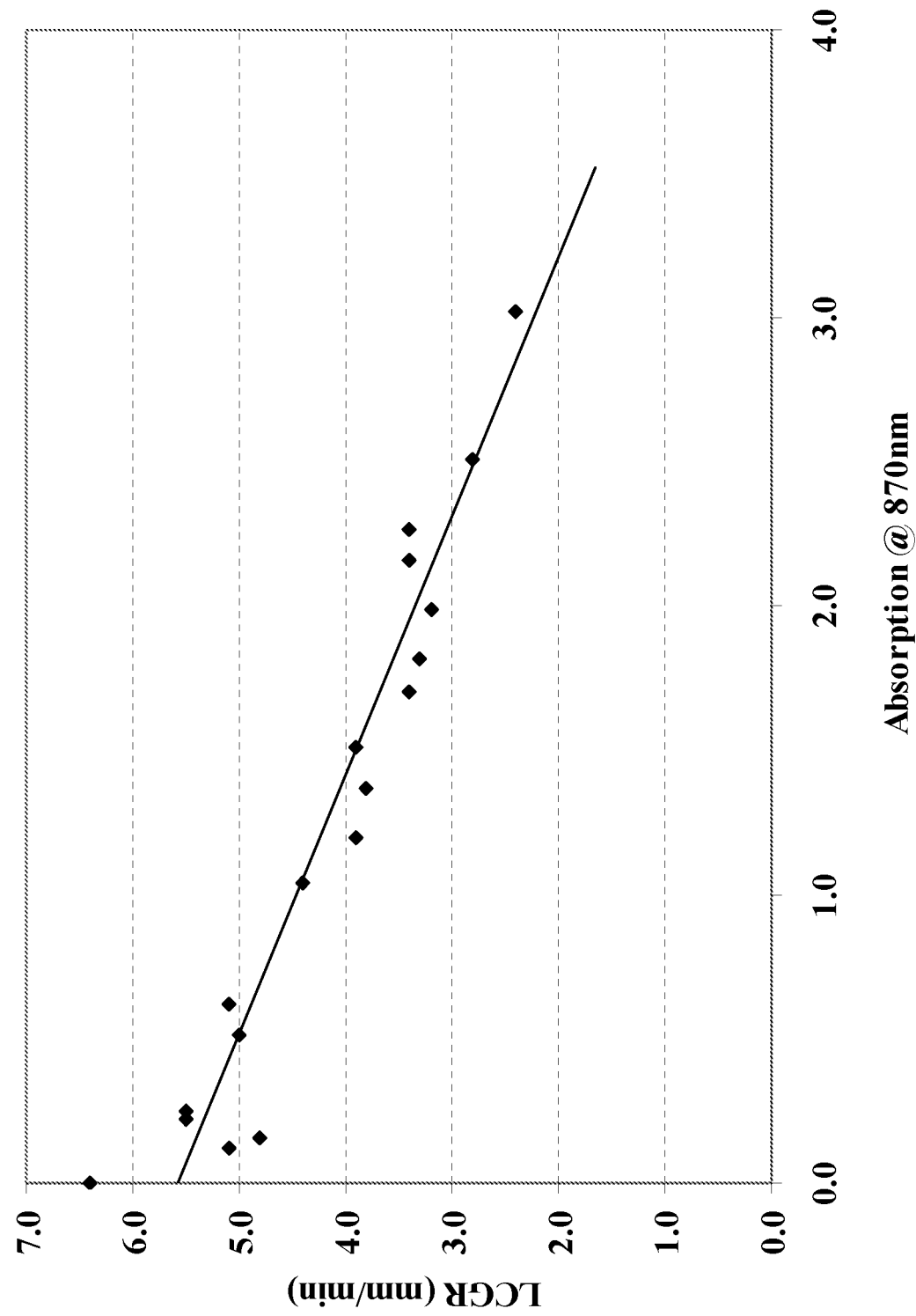
FIG. 1 is a plot of lateral copper growth rate in the electrodeposition of copper on a conductive polymer coating provided according to the polymerization method of the invention using monomer formulations based on the compositions of the invention. The lateral growth rate is plotted vs. oligomer content of the monomer formulation as indicated by absorption of UV radiation at 870 nm.

The catalyst composition according to the invention generally comprises at least one polymerizable monomer which is capable to form a conductive polymer; an emulsifier; at least one metallic or nitrogenous ion based on one or more from among lithium, sodium, aluminum, beryllium, bismuth, BxOy-anions, indium, and alkylimidazolium ions; and a high molecular weight polymeric acid (e.g., a polymeric acid having a molecular weight in excess of 500,000 Da).

Polymerizable Monomer

The polymerizable monomer for forming an electrically conductive polymer is, for example, a polymerizable heterocyclic aromatic molecule. Such monomers can react with an oxidant contained in an initiator solution by which a dielectric substrate is treated prior to being brought into contact with the inventive composition. Such an oxidant may be, e.g. manganese (IV) oxide deposited from an initiator solution comprising permanganate. The acid catalyzes the polymerization of the heterocyclic aromatic molecule on the oxidized surface of the dielectric substrate, which preferably is a polymeric resin substrate, thereby forming an electrically conductive polymer thereon. The heterocyclic aromatic molecule can be derived from a 5-membered heteroaromatic ring with one heteroatom (i.e., 5-membered ring with two double bonds) heterocyclic ring having the structure:

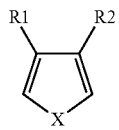

wherein: X is O, S, or N; and R1 and R2 are each independently hydrogen, a halogen, a substituted or unsubstituted alky group having from 1 to 8 carbon atoms, a substituted or unsubstituted alkoxy group having 1 to 8 carbon atoms, such as from 1 to 4 carbon atoms. The substituted or unsubstituted alkoxy group can be bonded to the 5-membered heterocyclic ring by the oxygen atom. Moreover, $R_1$ and $R_2$ can together form a five-membered ring or a six-membered ring through a substituted or unsubstituted alkyl group having 3 or 4 carbon atoms or through a substituted or unsubstituted alkyldioxy group having 1 or 2 carbon atoms. The substituted or unsubstituted alkyldioxy group can be bonded to the 5-membered heterocyclic ring by the oxygen atoms. Preferably, the heterocyclic aromatic molecule can be a substituted or unsubstituted thiophene (X is sulfur) because of its good conductivity and processability. A preferred substituent is an unsubstituted ethylenedioxy group bonded to the 5-membered thiophene ring by the two oxygen atoms such that the structure comprises a fused ring system comprising a 5-membered ring and a 6-membered ring. This material, known as 3,4-ethylenedioxythiophene (EDT), polymerizes into poly(3,4-ethylenedioxythiophene) (PEDOT), which is a preferred electrically conductive polymer because of its excellent conductivity. The structure of the preferred 3,4-ethylenedioxythiophene is shown:

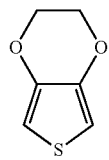

Emulsifier

As suitable emulsifiers, the inventive composition may comprise nonionic or anionic surfactants. Typically, nonionic surfactants are preferred. Without being bound to a particular theory, it is believed that nonionic surfactants provide stability benefits. In particular, formation of non-conductive oligomers of the polymerizable monomer may proceed at an undesirably rapid rate that reduces and may even prevent to some degree formation of the conductive polymer. Stabilizing the catalyst composition by the nonionic surfactant is thus believed to promote formation of the conductive polymer over the non-conductive oligomer. Suitable nonionic surfactants include various alkoxylated aralkylphenols, including ethoxylated tristyrylphenols. An especially preferred emulsifier is a product commercially available from Rhodia S.A. under the name SOPROPHOR TS 29, which has the following structure:

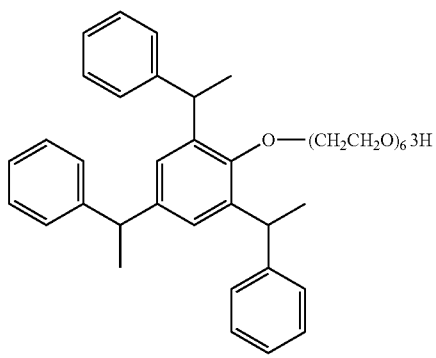

Additionally or alternatively, anionic surfactants may be utilized since their addition may also help to reduce the formation of non-conductive oligomers of the polymerizable monomers in the monomer formulation. Suitable anionic emulsifiers are, e.g. anionic polyarylphenolalcoxylates and their salts, an anionic aralkyl substituted sulfopolyalkoxylated phenol, e.g., a mono, di or tribenzyl or tri-(1-phenylethyl) substituted sulfopolyethoxylated or sulfopolypropoxylated phenol or anionic sulfoalkylated polyalkoxylated β-naphthols such as sulfoethylated sulfopropylated or sulfohexylated polyethoxylated or polypropoxylated naphthol and their salts, e.g. $NH_4^+$, $Na^+$, $Li^+$ or isopropylammonium salts.

One suitable anionic emulsifier is a product commercially available from Rhodia S.A. under the name SOPROPHOR 4D 384 having a molecular structure according to the following formula:

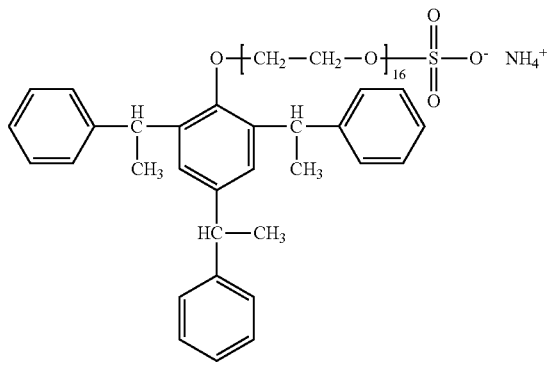

Another suitable anionic emulsifier is a compound commercially available from Rhodia S.A. under the name SOPROPHOR DSS/15, corresponding to poly(oxy-1,2-ethanediyl)alpha.-sulfo-.omega.-[bis(1-phenylethyl)phenoxy]-ammonium salt.

Another especially preferred emulsifier is a product commercially available from company Raschig GmbH, Germany under the name RALUFON NAPE 14 90 having a molecular structure according to the following formula:

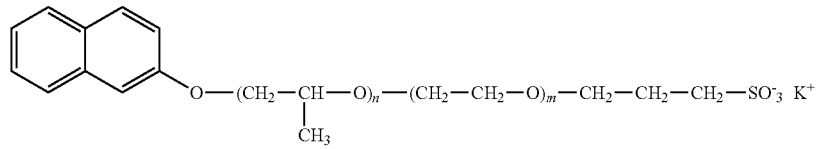

In general, the emulsifier can be comprised in the inventive composition within a range of between 0.1 mL/L to 200 mL/L, preferably between 5 ml/l and 100 mL/L, more preferred between 10 mL/L and 50 mL/L.

Metallic or Nitrogenous Ions

The metallic or nitrogenous ions incorporated into the catalyst composition are based on lithium, sodium, aluminum, beryllium, boron, indium or alkyl imidazolium. Preferred among these are lithium, sodium, aluminum, beryllium, boron, indium or alkyl imidazolium. Most preferred among these are lithium and sodium, and therefore various preferred embodiments incorporate either or both of lithium and/or sodium. All of these additive ions are cations except for the boron ion which is typically derived from an oxide of boron, and is thus, e.g., a borate ion such as $BO_3^-$ generated from dissociation of boric acid or $B_4O_7^-$ generated by dissociation of a borate salt such as borax in the catalyst solution. Thus, the boron ion is generically referred to herein as $B_xO_y$ anion. The addition of these ions reduces the tendency of the polymerizable monomers in the composition to form non-conductive oligomers. This increases the lifetime of the composition. Furthermore, these ions increase the average lateral metal growth rate during the electrolytic metal deposition over the whole life time of the composition for the formation of electrically conductive polymers on the surface by a factor of at least 50% as compared to catalyst compositions that do not contain these ions. The exact manner in which the metal cations, nitrogenous cations and/or borate ions function to retard oligomer formation is not fully understood, but it appears that they inhibit the acid from catalyzing oligomerization in the solution. The ions may be comprised in the composition in a concentration of between 0.001 mol/L and the solubility limit, preferably between 0.002 mol/L and 0.8 mol/L, more preferred between 0.04 mol/L and 0.4 mol/L.

Acid

Acids suitable for inclusion in the catalyst compositions generally include sulfuric acid, phosphoric acid, sulfonic acid, alkyl sulfonic acids (e.g., methanesulfonic acid, ethanesulfonic acid, etc.), polymeric sulfonic acids (preferably polystyrene sulfonic acid), polyphosphoric acid, isethionic acid, sulfosuccinic acid, aryl sulfonic acids (e.g., p-toluene sulfonic acids), and salts thereof. In a preferred embodiment, the acid is an alkyl sulfonic acid (e.g., methanesulfonic acid). In another preferred embodiment of the invention the acid is a polymeric acid. In a particularly preferred embodiment, the acid is a poly(vinylaryl) sulfonic acid such as polystyrene sulfonic acid.

Generally, the polymeric acid has an average molecular weight of ≥25,000 Da, ≥40,000, ≥50,000 Da, ≥75,000 Da, ≥100,000 Da, or even ≥200,000 Da. In accordance with some embodiments, the polymeric acid typically has an average molecular weight of between about 40,000 and about 300,000 Da, more typically between about 50,000 and about 300,000 Da, or between about 75,000 and about 300,000 Da, or between about 100,000 and about 300,000 Da.

It has been discovered that using a polymeric acid having an average molecular weight in these specified ranges functions to reduce the formation of non-conductive oligomers of the polymerizable monomers in the catalyst composition during its life cycle of use as a polymerization medium, reduces handling and storage by a factor of more than 50% in comparison to the compositions known from the corresponding state of the art, while not negatively influencing the formation of the intended conductive polymer structures on the substrate surface. The reduced formation of oligomers directly increases the lifetime of the composition by at least two times. This in turn reduces the need of refreshing or exchanging the composition on the plating side which directly provides economic benefit due to the reduced costs as well as ecological benefit due to the reduced waste.

In a particularly preferred alternative embodiment, the acid is a high molecular weight polymeric acid, in particular a polymeric acid having a molecular weight of at least 500,000 Da. As used herein, the term "high molecular weight polymeric acid" generally refers to a polymeric acid having a molecular weight in excess of 500,000 Da. Typically, in accordance with such embodiments, the molecular weight of the polymeric acid is at least about 600,000 Da, at least about 700,000 Da, at least about 800,000 Da, at least about 900,000 Da, at least about 1,000,000 Da, or even at least about 1,250,000 Da. For such embodiments, the molecular weight of the polymeric acid is typically between about 500,000 Da and about 1,500,000 Da, more typically between about 700,000 Da and about 1,300,000 Da, and even more typically between about 900,000 Da and about 1,100,000 Da. In these embodiments, the high molecular weight acid is preferably polystrene sulfonic acid, and more particularly atactic polystyrene sulfonic acid. In one preferred embodiment, the acid has a molecular weight of about 1,000,000 Da.

Use of the high molecular weight polymeric acid provides improvements in lateral copper growth (LCG) in various copper deposition systems. For example, LCG may be reduced to unacceptable levels (e.g., less than 2 millimeters per minute (mm/min)) over time during copper deposition. This 2 mm/min LCG limit is an industry threshold and may also be referred to herein as the LCG "border." Generally, the catalyst compositions of the invention avoid LCG reaching an unacceptable level of below 2 mm/min for a catalyst life of typically at least 20 days, at least 40 days, at least 60 days, or even at least 80 days. In particular the high molecular weight polymeric acid may provide improvements in LCG when used in combination with so-called "low-Cu" plating compositions as detailed elsewhere herein.

Improvement in LCG is currently believed to be related to the nature of deposited films provided by the high molecular weight acid systems of the present invention. The conductive polymer film includes metal ions (e.g., manganese, lithium and/or sodium), the conductive polymer formed from the polymerizable monomer, and the acid. One possible reason for improvements in LCG is longer chain, or "higher ordered" polymer films provided by the high molecular weight acid. One possible explanation for this is based on the polymerizable monomer (e.g., PEDOT) being aromatic in nature with the possibility that the PEDOT and acid are arranged in a layered arrangement (similar to graphene layers of graphite). The "free acid" portion of a high molecular weight acid provides a larger building block for the polymerizable monomer as compared to a lower molecular weight acid and therefore provides a more stable acid-PEDOT arrangement.

The higher molecular weight acid may also provide a more ordered and structured conductive polymer film without regard to any "layered" arrangement between the acid and PEDOT. A higher molar ratio of low molecular weight acid than high molecular weight acid is required to provide the same weight ratio of acid:PEDOT. For example, the increase in molar ratio for a 100,000 Da acid as compared to a 1,000,000 Da acid to provide the same weight ratio would be ten-fold. A more ordered and more structured acid-PEDOT arrangement is believed to be provided by the larger individual acid portions provided by the lower molar ratio for the higher molecular weight acid.

A more-ordered polymer film also provides conductivity advantages that result in more effective copper plating and/or allow for more effective use of low-Cu systems. Electron flow through the conductive polymer is anisotropic. Therefore a more ordered polymer film in the conductive direction of the polymer film reduces the copper concentration required and allows for effective copper deposition from a low-Cu system.

The conductive polymer (PEDOT) portion of the film is positively charged, while the acid is negatively charged and therefore may act as a counter ion to the conductive polymer. In accordance with the foregoing discussion, this arrangement may be observed in a planar or layered arrangement. In any case, the presence of the acid generally, and more particularly the high molecular weight acid in such an arrangement is currently believed to provide one or more advantages.

It is currently believed that there is cation exchange between hydrogen atoms of the acid of the conductive film and copper. Not all hydrogen atoms are exchanged, but this cation exchange may provide improvements in copper deposition. One reason for improved copper deposition is simply by providing a greater proportion of adsorbed copper in the polymer film in the direction of electron flow through the polymer film. In addition, more preferred positions of adsorbed copper may be provided by the cation exchange mechanism so that the nucleation sites in the polymer film increase and so too does copper growth increase. Therefore, the electrolytic deposition of copper becomes more effective.

It is currently believed that copper deposition incorporation by cation exchange is especially advantageous for low-Cu systems where a high MW acid has been used to form the polymer film. With less copper available for deposition more effective copper deposition is particularly advantageous as compared to high Cu systems where the greater proportion of copper available for deposition makes improvements in copper deposition less critical or impactful on copper deposition. The high MW acid also displays an advantage in that the difference between LCG for low-Cu and high-Cu systems is less than in the case of the use of a low MW acid.

The metal ions incorporated into the polymer layer may be identified by suitable analysis methods, including spectroscopy methods, including energy dispersive X-ray spectroscopy (EDX). It is currently believed that these metals may be incorporated into the conductive polymer film by a cation exchange between the hydrogen of the acid and/or alkali metals in the catalyst composition (e.g., Na and Li) and/or other components of the catalyst composition (e.g., Mn). One advantage of incorporating copper in this manner is contributing to advantageous electron transfer from the conductive polymer layer and reduced electrical resistance of the layer.

This incorporation of the metal ions also contributes to improvements in LCG with the metal ion, typically sodium, participating in ion exchange with the copper of the plating composition thereby enhancing the effectiveness of the copper plating. Since copper plating is more effective, the inventive catalyst composition renders the copper deposition process less sensitive to copper concentration of the plating composition. This enhanced copper deposition is also believed to contribute at least in part to the benefits of the inventive catalyst compositions that are particularly germane to low-Cu systems.

Additionally or alternatively, and without being bound to a particular theory, reduction in LCG to below unacceptable levels is currently believed to occur as oligomers are formed from the polymerizable monomer and build up in the system. This oligomer formation retards LCG. It is currently believed that the presence of the high molecular weight acid may retard oligomer formation, thereby advantageously leading to increased LCG. However, conversely, the overall increase in acid concentration by virtur of the high molecular weight acid is typically associated with a reduction in LCG, independent of oligomer formation. Therefore, preferably, the weight ratio of the high molecular weight acid to polymerizable monomer is selected or controlled to provide the above-noted benefit of reducing undesired oligomer formation, but avoiding an unacceptable decrease in LCG by presence of the higher concentration of acid provided by the high molecular weight acid. Typically, to balance these effects the weight ratio of polymerizable monomer to acid is about 1:1. Generally, however, the weight ratio of polymerizable monomer to acid in the catalyst composition may be between about 1:0.5 and about 1:5, between about 1:0.5 and about 1:3, between about 1:0.5 and about 1:2, or between about 1:0.75 and about 1:1.25.

High molecular weight polymeric acids such as polystyrene sulfonic acid having a molecular weight in excess of 500,000 Da are typically available in salt form. Thus, the composition may include an additional cation from this salt including, for example, cations such as Na and Li. In certain preferred embodiments, the sodium salt of the high molecular weight polymeric acid (e.g., the sodium salt of polystyrene sulfonic acid having a molecular weight of approximately 1,000,000 Da) is utilized and the at least one metallic or nitrogenous ion is provided by this component of the catalyst composition. One advantage of such a composition is that a stabilizing agent may not be required in the copper plating composition. The cation of the high molecular weight acid may function as the stabilizing agent for the copper plating composition.

This description of the invention focuses on metalizing the side walls of through holes and microvias drilled or otherwise formed in polymeric resin substrates. However, the metallization process of the present invention is also applicable to metalizing dielectric substrates generally. For example, the metallization process can be used to metalize one or both sides of a dielectric substrate in the manufacture of single or double copper laminated PCB substrates or multilayer copper laminated substrates.

The catalyst compositions are characterized by chemistries different from, and often simpler than, those known in conventional metallization processes and are useful in metallization processes which employ fewer steps and higher current densities than conventional metallization processes. All of these attendant advantages yield a metallization process which results in less solution waste, higher throughput, and a high quality plated PCB product.

The metallization process in which the inventive catalyst composition can be used is applicable to a variety of dielectric substrate materials. Appropriate substrate materials for printed circuit boards include, for example, fiber reinforced epoxy resin substrates (i.e., layers of fibrous materials bonded together under heat and pressure with a thermosetting resin). In general, an epoxy resin substrate comprises a continuous-filament glass cloth bonded with an epoxy-resin system. Specific examples of epoxy resin substrates include the following: G-10, which is a substrate comprising epoxy resin reinforced with glass fiber cloth sheets; FR-4, which is a self-extinguishing substrate similar to G-10; G-11, which is a glass cloth and epoxy mixture; and FR-5, which is a flame-resistant version of G-11. FR-4 substrates can be reinforced with ceramic particles, such as those available from Rogers Corporation (Chandler, Ariz.). Other resins include polyphenylene ether, cyanate ester, and bismaleimide/triazine.

Additional dielectric materials which can be substrates for metallization include ceramics, glass, Teflon, glass fiber-reinforced Teflon, ceramic-reinforced Teflon, polystyrene, and polyimide (for flexible board applications).

In addition to the above-described materials, the substrate may comprise, for example, a semiconductor material such as silicon, $SiO_2$, or gallium arsenide, or an inorganic oxide such as alumina, titanium, or zirconium.

To manufacture a PCB substrate, the dielectric substrates described above are laminated on one or both sides with copper foil by conventional processes. Commonly used laminates have an 18 μm thick copper clad. Multilayer circuit boards are formed by stacking up to 16 copper layers separated and supported by the above-described substrate materials. To form an electrical connection between copper layers, the PCB substrates are drilled with through holes (holes extending through the entire depth of the PCB or multilayer circuit board) and blind vias (holes which extend only part of the depth of the PCB or multilayer circuit board), such as by carbide bits and laser drilling. The drilled through holes and blind vias can be metalized using the metallization process of the present invention.

Alternatively, the inventive catalyst composition can be used in a metallization process to laminate the entire surface of the above-described dielectric substrates with, e.g., a copper layer, in place of conventional copper laminating. After copper deposition/electrolytic plating using the composition and process of the present invention, the PCB substrate can be drilled with through holes and blind vias, which can also be metalized using the metallization process of the present invention.

In yet another alternative, the metallization of drilled through holes and blind vias in a copper laminated PCB substrate can occur concurrently with the formation of a copper conducting pattern.

Holes through a PCB are typically drilled with carbide drill bits. When very small vias are required, the vias may be formed by lasers. Laser-drilled vias, called microvias, typically have an inferior surface finish inside the hole, which presents a challenge in their metallization. These holes are called microvias. The industry is moving toward microvias having diameters below 150 m and which can be deeper than they are wide such that they have high aspect ratios.

Aspect ratios are typically at least about 0.5:1, and in some cases greater than about 1:1. In this description, the aspect ratio is the ratio of the via depth to the width of the via opening. It is also possible with controlled-depth drilling, laser drilling, or by pre-drilling the individual sheets of the PCB before copper lamination, to produce holes that connect only some of the copper layers, rather than passing through the entire board. These holes are called blind vias when they connect an internal copper layer to an outer layer, or buried vias when they connect two or more internal copper layers.

The walls of the through holes and blind vias can be metalized using the metallization process of the present invention.

A metallization process using the composition of the present invention can metalize dielectric substrates such as the glass fiber reinforced epoxy resin substrates commonly used in PCB manufacture. The process is applicable to plate the side wall of a drilled through hole or microvia with copper and can also be used to metalize a dielectric substrate to produce a single or double copper covered PCB substrate. In one embodiment, the steps for rendering a non-conductive substrate electrically conductive and amenable to electrolytic copper plating include:

1. Conditioning an exposed surface of a dielectric substrate (such as a side wall of a through hole or microvia) by exposing the substrate to a conditioning solution to render the exposed surface wettable.
2. Water rinse.
3. Oxidizing the conditioned exposed surface of the dielectric material in the through hole and microvia with a composition comprising an oxidant.
4. Water rinse.
5. Catalyzing the oxidized exposed surface with an inventive catalyst solution comprising a polymerizable heterocyclic aromatic molecule, an acid, an emulsifier and at least one metal-ion selected from the group consisting of lithium-ions, sodium-ions, aluminum-ions, beryllium-ions, bismuth-ions, boron-ions, indium-ions, and/or alkylimidazolium ions to deposit an electrically conductive polymer on the oxidized exposed surface of the dielectric material and thereby render that surface electrically conductive.
6. Water rinse.

The substrate can then be metalized by exposing the surfaces of the dielectric substrate having electrically conductive polymer thereon to an electrolytic copper plating bath comprising an anode and an electrolytic copper plating composition and applying an external source of electrons.

The conditioner solution in the above described metallization process can comprise the components described in German Patent Application DE4205190, which is incorporated by reference herein in its entirety. For example, the conditioner solution can contain at least 0.001% by weight of a heterocyclic aromatic molecule comprising nitrogen, a crosslinker, and a pH buffering agent. Exemplary aromatic molecule comprising nitrogen include pyridine, quinoline, pyrrole, indole, acridine, isoquinoline, pyridazine, pyrimidine, quinoazoline, phenazine, cinnoline, pteridine, carbazole, pyrazole, imidazole, triazole, benzimidazole, purine, isoindole, derivatives thereof, and mixtures thereof. Exemplary conditioner solutions are available from Enthone Inc. (West Haven, Conn.) and include Envision® HDI Conditioner 7310, Envision® DMS-E Conditioner 7010, Envision® DMS-E Conditioner 7015, and Envision® DMS-E Conditioner 7310.

Exposing surfaces of dielectric materials to the conditioning solution conditions the surfaces for oxidation in the next step by rendering the surfaces wettable. Wetting the holes and vias before oxidation is advantageous for holes and vias having small diameters, which may be less than about 100 μm, or even less than about 50 μm, which are becoming increasingly common in drilled PCB substrates. The dielectric substrate can be exposed to the conditioner solution by any method such as flood, dip, or spray with the proviso that the exposure method adequately wets the exposed surfaces of the dielectric substrate, such as, for example, the sidewalls of through holes and microvias. Exposure is typically at temperatures between about 30° C. to about 65° C., such as between about 30° C. to about 50° C. or about 40° C. to about 65° C., for between about 1 and about 6 minutes, such as between about 2 to 5 minutes or about 1 to 3 minutes.

The initiator composition in the above described metallization process comprises an oxidant. The oxidant can be selected from known classes of oxidants such as manganese (VII) compounds, manganese (VI) compounds, iodine (VII) compounds, and cerium (IV) compounds. The above-described compounds are preferably oxygen compounds. For example, the oxidant can be permanganate, manganate, and periodate. A preferred oxidant is permanganate, which can be provided as the sodium or potassium salt. When permanganate is the oxidant in the initiator solution, exposure of the conditioned surfaces of the dielectric substrate oxidizes the surface of the exposed dielectric and yields a surface having a manganese (IV) oxide ($MnO_2$) film deposited thereon. This surface serves as an oxidant too and is needed for the subsequent polymerization. $MnO_2$ is consumed and Mn (II) ions are formed. The density of the manganese (IV) oxide film is dependent upon factors such as oxidant concentration in the initiator solution, exposure time, and the manner of exposure. Typically, the concentration of permanganate in the initiator solution is between about 40 g/L and about 70 g/L, such as about 60 g/L. The initiator composition may contain additional wetting agents such as ionic or nonionic fluoro-surfactants to improve the manganese (IV) oxide deposition.

The initiator contains usually boric acid as a buffer, when operated at pH 6. Phosphoric acid is used for pH adjustment during production. Initiator constituents are known in the art and are disclosed, for example, in DE 4113654, incorporated by reference.

The conditioned surfaces of the polymeric resin substrate can be exposed to the initiator solution by any method such as flood, dip, or spray with the proviso that the exposure method is adequate to produce a manganese (IV) oxide film having a $MnO_2$ density on the conditioned surfaces between about 1 $mg/dm^2$ and about 10 $mg/dm^2$, such as between about 4 $mg/dm^2$ and about 6 $mg/dm^2$, on the exposed conditioned surfaces of the dielectric substrate. Exposure is typically at temperatures between about 80° C. to about 90° C. for between about 3 and about 6 minutes. Exemplary initiator solutions are available from Enthone Inc. (West Haven, Conn.) and include Envision® HDI Initiator 7320 and Envision® DMS-E Initiator 7020.

The catalyst solution in the above described metallization process can be the inventive composition as described in the above and the following embodiments.

The catalyst composition can be buffered to a suitable pH using buffering agents such as alkali metal salts of hydrogen phosphate, dihydrogen phosphate, and acetate. Solvent suitable for use in the catalyst composition include methanol, ethanol, n-propanol, isopropanol, higher alcohols, polyalcohols, DMF (dimethyl formamide), ketones, more particularly methylethylketone, cumene sulfonate, N-methyl pyrrolidone, triglyme, diglyme, alkali metal salts of toluene sulfonates or their ethyl esters, aqueous alkaline solutions, or mixtures thereof.

Exposure of the oxidized surfaces of the dielectric substrate to the catalyst composition initiates a reaction between the $MnO_2$ film on the oxidized surface, the polymerizable heterocyclic aromatic molecule, and the acid which results in polymerization and deposition of an electrically conductive polymer on exposed oxidized surfaces of the dielectric substrate. Exposure can be by flooding, dipping, or spraying and typically occurs at room temperature or slightly below room temperature for between about 1 and about 8 minutes, such as between about 2 minutes and about 4 minutes. Exemplary catalyst solutions are available from Enthone Inc. (West Haven, Conn.) and include Envision® HDI Catalyst 7350 and Envision® DMS-E Catalyst 7050.

Exposure of the surface of the polymeric resin substrate to the catalyst solution which thereby yields an electrically conductive polymer deposited thereon is normally followed by a rinse step, which is followed by exposure to an electrolytic copper plating bath, the bath comprising an electrolytic copper plating composition and an anode. The electrolytic copper plating composition comprises a source of copper ions and an acid. The electrolytic copper bath may also comprise additives such as chloride ion, brighteners, inhibitors, and grain refiners, which are known in the art.

As briefly noted, it has been discovered that use of the high molecular weight acid in the inventive compositions increases useful the life of the catalyst composition.

To maintain an optimum proportion of the high molecular weight acid in the catalyst composition during use there may be employed a strategy whereby a portion of the catalyst composition is continually being introduced while a portion of the catalyst is removed or allowed to overflow from the catalyst treatment vessel. In such a strategy, what would be from about 10% to about 20% (e.g., about 15%) of the total proportion of the catalyst composition remaining in the vessel is removed from or allowed to exit the vessel. It is currently believed that utilizing the catalyst composition in this manner maintains the concentration of the high molecular weight acid in the catalyst composition as near as possible an optimum level and therefore provides the maximum performance and benefits in terms of LCG.

A further benefit of the inventive catalyst composition is providing improvements in copper deposition speed. For example, the inventive catalyst compositions may result in copper deposition processes where higher rates of copper deposition are achieved. As noted, LCG in excess of 2 mm/min are often used as an industry threshold or benchmark for evaluating copper deposition. The inventive catalyst compositions provide LCG rates in excess of 2 mm/min for at least 20 days, at least 40 days, at least 60 days, or even at least 80 days. In particular, the inventive high molecular weight acid catalyst compositions provide LCG rates in excess of 2 mm/min, including at or near even higher levels such as 3 mm/min when used in connection with low-Cu plating compositions. For example, over the course of a number of weeks—e.g., at least about 6 weeks, at least about 8 weeks, or about 10 weeks—the high molecular weight acid composition results in maintaining LCG at a rate at or near 3 mm/min. Combining the same catalyst composition with a high-Cu plating composition has been observed to provide LCG that remains near 2 mm/min for a period of time, eventually dipping below the threshold value of 2 mm/min well before the same catalyst composition does in combination with a low-Cu plating composition. Overall, this improvement may provide an increase in copper plating of at least 25%, at least about 40%, or even at least 50% as determined by the mass of copper deposited and/or the average rate of LCG for a period of time. For example, in certain embodiments, an average LCG of greater than 2.5 mm/min is achieved for at least 6 weeks, at least 8 weeks, or at least 10 weeks. Typically, in accordance with such embodiments, the LCG is above 2 mm/min during the entire period over which the average LCG is determined.

Sources of copper ions include copper sulfate, copper sulfate pentahydrate, copper oxide, copper carbonate, copper fluoroborate, copper pyrophosphate, copper cyanide, copper phosphonate, and other copper metal complexes such as copper methane sulfonate. Preferably, the copper source is one of the copper sulfate-based sources, namely, copper sulfate or copper sulfate pentahydrate. The concentration of copper can vary over wide limits; for example, from about 5 to about 75 g/L Cu. In "low Cu" systems (i.e. electrolytes comprising a low concentration of copper), the Cu ion concentration is typically between about 5 g/L and about 30 g/L, such as between about 8 g/L to about 25 g/L. Exemplary low Cu systems can comprise 8 g/L copper ions, 10 g/L copper ions, 20 g/L copper ions, or 25 g/L copper ions.

Customers in the printed wiring board (PWB) business often prefer to use low Cu systems for various performance reasons. Unfortunately, however, low Cu systems often suffer from problems in connection with lateral copper growth (LCG). In current low Cu systems, LCG may be reduced to below 2 millimeters. Advantageously, in accordance with the present invention it has been discovered that using a high molecular weight acid, in particular a high molecular weight polymer acid such as polystyrene sulfonic acid avoids these problems and/or provides improvements in LCG in low Cu systems. This therefore allows use of the preferred low Cu system in PWB manufacture while avoiding LCG problems. In particular, in connection with low Cu systems, the inventive catalyst compositions result in LCG remaining above 2 mm/min for at least about 7 days, at least about 30 days, or even at least about 70 days. Additionally or alternatively, LCG in excess of 1 mm/min or in excess of 1.5-mm/min is achieved within the first 5 minutes of copper deposition.

In other, "high Cu" systems (i.e. electrolytes comprising a high concentration of copper), the Cu ion concentration can be between about 35 g/L and about 75 g/L, preferably between about 35 g/L and about 60 g/L, such as between about 38 g/L and about 42 g/L. In some high Cu systems, the Cu ion concentration can be between about 46 g/L and about 60 g/L, such as between about 48 g/L and about 52 g/L. In an exemplary high Cu system, the Cu ion concentration is about 40 g/L.

In another exemplary high Cu system, the Cu ion concentration is about 50 g/L. In yet another exemplary high Cu system, the Cu ion concentration is about 75 g/L. To achieve a copper concentration of about 5 g/L, about 19 grams of copper sulfate pentahydrate is added per 1 L of solution. To achieve a copper concentration of about 75 g/L, about 292 grams of copper sulfate pentahydrate is added per 1 L of solution. The inventive catalyst composition addresses various problems in connection with low Cu systems, but it is to be understood that the compositions are also effective in high Cu systems.

Chloride ion may also be used in the electrolytic plating bath at a level up to 200 mg/L, such as between about 40 mg/L and about 200 mg/L or about 10 to 90 mg/L. Chloride ion is added in these concentration ranges to enhance the function of other bath additives. Typical sources of chloride ion include hydrochloric acid and alkali metal salts of chloride, most typically sodium chloride. Other additives, which are known in the art, such as brighteners, inhibitors, and grain refiners can be added. Preferred electrolytic copper plating additives are the Cuprostar® LP-1 Additives available from Enthone Inc. (West Haven, Conn.), which may be added in a concentration between about 2 mL/L and about 8 mL/L, more preferably between about 3 mL/L and about 6 mL/L, such as about 4 mL/L or about 5 mL/L. Sources of acid in the electroplating bath include sulfuric acid, methane sulfonic acid, phosphoric acid, and certain polymer acids such as polystyrene sulfonic acid. Typically, in conventional copper electroplating compositions, the acid can be present in a concentration between about 50 g/L and about 300 g/L, more typically between about 100 g/L and about 220 g/L, such as about 200 g/L.

In a preferred embodiment of the present invention, the concentration of acid in the catalyst composition is kept low, such as between about 0.1 g/L and about 30 g/L, more preferably between about 1 g/L and about 3 g/L to achieve a solution pH between about 1 and about 3.5, preferably between about 1.5 and about 3.5, more preferably between about 1.5 and about 2.5, such as about 2. For example, sulfuric acid can be added in a concentration of about 1 g/L to achieve a solution pH of about 2. Alternatively, in one preferred embodiment, a polymer acid, such as polystyrene sulfonic acid can be added in a concentration of about 2.5 g/L to achieve a solution pH of about 2. To achieve the pH of between about 1.5 and 2.5 in accordance with this invention, acid additions on the order of about 1 g/L are employed, such as between about 0.5 g/L and about 10 g/L, or between about 0.5 g/L and about 5 g/L. This is in contrast to conventional acid copper baths which employ at least 50 g/L acid, e.g., about 200 g/L sulfuric acid. The pH of conventional bath is usually not measured or is not measurable, so acidity is characterized in terms of g/L acid. This aspect of the invention applies to conventional plating over conductive substrates, as well as to plating over dielectric substrates treated with an electrically conductive polymer.

In another embodiment of the inventive catalyst composition, the catalyst composition additionally comprises a source of copper ions, and the rinse step occurring after exposure to the catalyst solution is eliminated. In this embodiment, components of the catalyst composition and components of the electrolytic copper plating composition are combined into a single composition. This composition is capable of both depositing an electrically conductive polymer on an exposed surface of dielectric substrate and depositing copper on the surface of the electrically conductive polymer with an applied current. This is not possible with normal copper baths because of the high acid concentration and monomer (EDT) precipitation.

An exemplary catalyst composition/electrolytic copper plating composition comprises a polymerizable heterocyclic aromatic molecule, a source of copper ions, an acid, and other additives which are typically added to the electrolytic copper plating composition. Preferred catalyst compositions and/or catalyst/electrolytic plating compositions of some embodiments of the present invention include a high molecular weight acid having a molecular weight in excess of 500,000 Da (e.g., polymeric polystyrene sulfonic acid having a molecular weight of approximately 1,000,000 Da). The identities and the concentrations of the components of the catalyst composition/electrolytic copper plating composition are substantially the same as those described above in connection with the separate solutions.

In certain embodiments, however, one exception is that the inventive catalyst composition of the present invention includes an anti-foaming agent.

A further advantage of the inventive catalyst composition is that a stabilizer is not required in either the catalyst composition or the electrolytic plating solution. As noted, the metallic ion (e.g., Li or Na) may function as a stabilizer for the electrolytic plating solution.

Among the advantages of this combined solution and combined operation are the elimination of an intermediate rinse step, elimination of the need for separate catalysis and electrolytic plating vessels, and reduced overall process times.

In carrying out the process using the catalyst composition of the present invention, the compositions described above are used to deposit copper over the side walls of through holes and microvias of a single or double copper laminated PCB substrate or multilayer circuit board substrate. In one embodiment, the process of plating copper over the side walls of through holes and microvias comprises the following steps:
1. Drill through holes or microvias in a single or double copper laminated PCB substrate or multilayer circuit board substrate using carbide bit or laser drilling.
2. Conditioning the exposed surfaces of the through hole or microvia walls by exposing the substrate to Envision® DMS-E Conditioner 7015 (40 mL/L) for 3 minutes at 40° C.
3. Water rinse.
4. Oxidize the exposed conditioned surfaces (and simultaneously deposit Mn(IV)oxide) of the through hole or microvia walls by exposing the substrate to Envision® DMS-E Initiator 7020 (60 g/L potassium permanganate and 10 g/L boric acid, pH 6) for 3 minutes at 80° C.
5. Water rinse.
6. Deposit electrically conductive polymer on the oxidized surfaces of the through hole or microvia walls by exposing the substrate to a composition comprising Envision® HDI Catalyst 7350A (15 mL/L, containing 3,4-ethylenedioxythiophene and emulsifier) and Envision® HDI Catalyst 7350B (45 mL/L, containing polystyrenesulfonic acid), and at least one metallic or nitrogenous ion selected from the group consisting of lithium-ions, sodium-ions, aluminum-ions, beryllium-ions, bismuth-ions, boron-ions, indium-ions, and alkylimidazolium ions.
7. Water rinse.
8. Electrolytically plate copper over the electrically conductive polymer on the surfaces of the through hole or microvia walls by
    (a) exposing the substrate to an electrolytic plating bath comprising an anode and an electrolytic copper plating composition comprising copper sulfate pentahydrate (80 g/L), sulfuric acid (1 g/L to achieve pH 2), chloride ion (60 mg/L), and Cuprostar® LP-1 additives (5 mL/L), and
    (b) applying current (3 A, 5 minutes) to the substrate to deposit copper on the through holes walls and microvias.

Using the above-described method, a high quality copper deposit can be plated on through hole and microvia walls in a PCB or multilayer circuit board substrate. The above described process can also be used to plate a copper laminate on a bare dielectric substrate (i.e., a glass fiber reinforced epoxy resin substrate) having no pre-applied copper foil. Additionally, the above described process can also be used to plate a copper laminate over one or both sides and plate copper over the sidewalls of through holes and microvias of a bare dielectric substrate (i.e., a glass fiber reinforced epoxy resin substrate), which has been pre-drilled with through holes.

In another embodiment, the process of plating copper over the side walls of through holes and microvias comprises the following steps:
1. Drill through holes or microvias in a single or double copper laminated PCB substrate or multilayer circuit board substrate using carbide bit or laser drilling.
2. Condition the exposed surfaces of the through hole or microvia walls by exposing the substrate to Envision® DMS-E Conditioner 7015 (40 mL/L) for 3 minutes at 40° C.
3. Water rinse.
4. Oxidize the exposed conditioned surfaces of the through hole or microvia walls by exposing the substrate to Envision® DMS-E Initiator 7020 (60 g/L potassium permanganate and 10 g/L boric acid, pH6) for 3 minutes at 80° C.
5. Water rinse.
6. Deposit electrically conductive polymer on the oxidized surfaces of the through hole or microvia walls by exposing the substrate to a catalyst solution/electrolytic plating composition comprising Envision® HDI Catalyst 7350A (15 mL/L, containing 3,4-ethylenedioxythiophene and emulsifier) and Envision® HDI Catalyst 7350B (15 mL/L, containing polystyrenesulfonic acid), at least one metallic or nitrogenous ion selected from the group consisting of lithium-ions, sodium-ions, aluminum-ions, beryllium-ions, bismuth-ions, boron-ions, indium-ions, and alkylimidazolium ions, copper sulfate pentahydrate (80 g/L), sulfuric acid (1 g/L to achieve pH 2), chloride ion (60 mg/L), and Cuprostar® LP-1 additives (5 mL/L) for 3 minutes.
7. Electrolytically plate copper on the surfaces of the through hole or microvia walls having conductive polymer thereon by applying current (1 to 2 A/dm$^2$, 5 minutes) to the substrate to deposit copper on the through holes walls and microvias.

Using the above-described method, a high quality copper deposit can be plated on through hole and microvia walls in a PCB or multilayer substrate.

In yet another embodiment, the process using the catalyst composition of the present invention can be used to plate copper over the walls of through holes and microvias in a PCB or multilayer substrate, which is further processed to yield a copper conducting pattern. The steps in this process are:
1. Drill holes through a glass fiber reinforced epoxy resin substrate which has been laminated on one or both sides with copper by a conventional process or by one of the processes described above.

2. Treat the drilled board with conditioner, initiator, and the inventive catalyst compositions to deposit an electrically conductive polymer film on sidewalls of the drilled through holes.
3. Apply a photo resist to the copper foil.
4. Apply a pattern mask in which the copper conducting pattern is dark and the rest of the mask is clear.
5. Irradiate the mask with ultraviolet light to render soluble the photoresist material underneath the light areas which determine the copper conducting pattern.
6. Remove the pattern mask.
7. Apply alkaline developer which dissolves the not irradiated photoresist (soluble in developer, which contains usually sodium carbonate). In this case, a negative image is generated, so called additive technology. The photoresist is removed where the copper tracks will be formed. In the subsequent plating the copper is deposited in the "grooves" between irradiated resist and in the through-holes or microvias.
8. Electrolytically plate copper over the exposed pattern to a thickness of about 5 microns (also plates through holes) using the electrolytic copper plating bath at pH 2. For the subsequent plating to 25 microns (normal thickness), copper baths with high acid content, from about 200 g/L to about 250 g/L can be used.
9. Protect the copper conductor pattern with tin-lead or other resist material, which prevents oxidation and acts as a resist pattern.
10. Dissolve the remaining photoresist with solvent. (Typically in strongly alkaline solutions, as are commercially available.)
11. Dissolve the copper foil with acid, exposing the resin substrate. The copper conducting pattern is not dissolved because it is protected by the resist.
12. Remove the metallic resist.

Accordingly, the process using the catalyst composition of the present invention can be used to selectively metalize exposed surfaces of a copper clad dielectric substrate, e.g. the sidewall of a through hole which has been drilled through the dielectric substrate, to establish an electrical connection between the copper laminate on one side of the epoxy-glass fiber substrate with the copper laminate on the other side of the epoxy-glass fiber substrate. The process can also be used to metalize the entire surface of a dielectric substrate.

In another aspect, the invention relates to a conductive polymer layer on a dielectric substrate, characterized in that the polymer layer comprises a metal ion or other metallic or nitrogenous ion selected from the group consisting of lithium, sodium, aluminum, beryllium, bismuth, boron, indium, and alkylimidazolium. Surprisingly it was found that when using a composition for the formation of electrically conductive polymers on the surface of a dielectric substrate as described above, the metallic or nitrogenous ions comprised in the composition are incorporated into the conductive polymer layer. While not being bound to this theory, it is believed that this incorporation of metal ions into the conductive polymer layer contributes to the conductivity of the conductive polymer layer, thereby reducing the electrical resistance of the layer.

The metallic or nitrogenous ion selected from the group consisting of lithium, sodium, aluminum, beryllium, bismuth, boron, indium and alkylimidazolium can be comprised in the conductive polymer layer in a concentration of at least 0.01 atomic %, preferably at least 0.05 atomic %, more preferably at least 0.1 atomic %. The concentration of this metallic or nitrogenous ion in the conductive polymer layer is preferably no more than 1 atomic %, such as no more than 0.5 atomic %.

The incorporation of these ions into the metal surface can be measured via appropriate analysis methods, like e.g. ESCA (electron spectroscopy for chemical analysis), GDOES (glow discharge optical emission spectroscopy), or AES (Auger electron spectroscopy).

The following examples further illustrate the present invention.

FIG. 1 is a projection showing the dependence of the lateral copper growth from the concentration of non-conductive oligomers in the monomer formulation (catalyst solution) with which the dielectric substrate is contacted to form the conductive polymer coating on which the copper is electrolytically deposited.

FIG. 1 shows the dependency of the lateral copper growth (LCGR) on a substrate surface on the concentration of non-conductive oligomers in a catalyst composition used to deposit a conductive polymer film on the substrate surface. As one can gather from FIG. 1, the LCGR on a standard test coupon (laminate material IS 410 with a strip size of 10 by 3 cm and a copper free area of 7 by 3 cm) treated according a conventional method to deposit a conductive polymer film known from the art, like e.g. the ENVISION HDI process, decreases with an increasing concentration in the catalyst composition of oligomers of the monomeric compounds from which the polymer is to be formed. After the deposition of the conductive polymer film, the test coupons are copper plated in a copper electrolyte commercial available from ENTHONE Inc. under the name LP-1, for 5 min. at a current density of $2 A/dm^2$. The relative concentration of the oligomers in the catalyst composition is measured by the absorption at 870 nm in the UV-VIS spectra. While the absorption of a fresh catalyst composition at 870 nm is in the range of about zero and the LCGR is at about 5.5 mm/min, the LCGR decreases down to about 2.5 mm/min when the absorption caused by the non-conductive oligomers increases to about 3.0. This provides evidence of the role of the non-conductive oligomers in the catalyst composition with respect to the subsequent metal plating process.

Example 1

Example 1 is used as a comparative and represents a catalyst composition according to the state of the art. In a 1000 mL beaker 500 mL of deionized water are provided. 45 mL of Envision® HDI Catalyst 7350B (containing polystyrenesulfonic acid) and 15 mL of Envision® HDI Catalyst 7350A (containing 3,4-ethylenedioxythiophene and emulsifier) are added under stirring. The mixture is filled up to a volume of 1000 mL by 440 mL dionized water. The pH-value of the mixture is 2.2 at 23° C. The catalyst composition absorption values at 870 nm in the UV-VIS spectra after several days of service lifetime are listed in table 1.

Example 2

In a 1000 mL beaker 500 mL of deionized water are provided. 45 mL of Envision® HDI Catalyst 7350B (containing polystyrenesulfonic acid) and 15 mL of Envision® HDI Catalyst 7350A (containing 3,4-ethylenedioxythiophene and emulsifier) are added under stirring. To this mixture 2.6 g of $BeSO_4*4H_2O$ are added. The mixture is filled up to a volume of 1000 mL by 440 mL dionized water. The pH-value of the mixture is 2.18 at 25.8° C. The catalyst composition absorption values at 870 nm in the UV-VIS spectra after several days of service lifetime are listed in table 1.

Example 3

In a 1000 mL beaker 500 mL of deionized water are provided. 45 mL of Envision® HDI Catalyst 7350B (containing polystyrenesulfonic acid) and 15 mL of Envision® HDI Catalyst 7350A (containing 3,4-ethylenedioxythiophene and emulsifier) are added under stirring. To this mixture 3.8 g of $Al_2(SO_4)_3*16H_2O$ are added. The mixture is filled up to a volume of 1000 mL by 440 mL dionized water. The pH-value of the mixture is 2.21 at 25.8° C. The catalyst composition absorption values at 870 nm in the UV-VIS spectra after several days of service lifetime are listed in table 1.

Example 4

In a 1000 mL beaker 500 mL of deionized water are provided. 45 mL of Envision® HDI Catalyst 7350B (containing polystyrenesulfonic acid) and 15 mL of Envision® HDI Catalyst 7350A (containing 3,4-ethylenedioxythiophene and emulsifier) are added under stirring. To this mixture 1.9 g of $Li_2SO_4*1H_2O$ are added. The mixture is filled up to a volume of 1000 mL by 440 mL dionized water. The pH-value of the mixture is 2.19 at 25.8° C. The catalyst composition absorption values at 870 nm in the UV-VIS spectra after several days of service lifetime are listed in table 1.

Example 5

In a 1000 mL beaker 500 mL of deionized water are provided. 45 mL of Envision® HDI Catalyst 7350B (containing polystyrenesulfonic acid) and 15 mL of Envision® HDI Catalyst 7350A (containing 3,4-ethylenedioxythiophene and emulsifier) are added under stirring. To this mixture 2.95 g of $Li_2CO_3$ are added. The mixture is filled up to a volume of 1000 mL by 440 mL dionized water. The pH-value of the mixture is 2.3 at 25.8° C. The catalyst composition absorption values at 870 nm in the UV-VIS spectra after several days of service lifetime are listed in table 1.

Example 6

In a 1000 mL beaker 500 mL of deionized water are provided. 46 mL of Envision® HDI Catalyst 7350B (containing polystyrenesulfonic acid) and 15 mL of Envision® HDI Catalyst 7350A (containing 3,4-ethylenedioxythiophene and emulsifier) are added under stirring. To this mixture 1 mL of bismuth methansulfonic acid is added. The mixture is filled up to a volume of 1011 mL by 449 mL dionized water. The pH-value of the mixture is 1.85 at 22.2° C. The catalyst composition absorption values at 870 nm in the UV-VIS spectra after several days of service lifetime are listed in table 1.

Example 7

In a 1000 mL beaker 500 mL of deionized water are provided. 46 mL of polystyrenesulfonic acid having an average molecular weight of approximately 75 kDa (commercially available under the name Versa TL 77 by AkzoNobel AB) and 15.5 mL of Envision® HDI Catalyst 7350A (containing 3,4-ethylenedioxythiophene and emulsifier) are added under stirring. To this mixture 2.5 g of $BeSO_4*4H_2O$ are added. The mixture is filled up to a volume of 1002 mL by 440 mL dionized water. The pH-value of the mixture is 3.46 at 22.2° C. By addition of 26 drops of sulfuric acid (50%) the pH-value is set to 1.97 at 22.3° C. The catalyst composition absorption values at 870 nm in the UV-VIS spectra after several days of service lifetime are listed in table 1.

Example 8

In a 1000 mL beaker 500 mL of deionized water are provided. 45 mL of polystyrenesulfonic acid having an average molecular weight of approximately 1000 kDa (commercially available under the name Versa TL 501 by AkzoNobel AB) and 15.5 mL of Envision® HDI Catalyst 7350A (containing 3,4-ethylenedioxythiophene and emulsifier) are added under stirring. To this mixture 4.0 g $MnSO_4*H_2O$ are added. The mixture is filled up to a volume of 1001 mL by 440 mL dionized water. The pH-value of the mixture is 6.1 at 22.3° C. By addition of 32 drops of sulfuric acid (50%) the pH-value is set to 1.99 at 22.3° C. The catalyst composition absorption values at 870 nm in the UV-VIS spectra after several days of service lifetime are listed in table 1.

Example 9

In a 1000 mL beaker 500 mL of deionized water are provided. 23 mL of polystyrenesulfonic acid having an average molecular weight of approximately 1000 kDa (commercially available under the name Versa TL 501 by AkzoNobel AB), 23 mL of a poly(4-styrenesulfonic acid) lithium salt solution (30% by weight in $H_2O$) having an average molecular weight of 75 kDa and 15 mL of Envision® HDI Catalyst 7350A (containing 3,4-ethylenedioxythiophene and emulsifier) are added under stirring. The mixture is filled up to a volume of 1001 mL by 440 mL dionized water. The pH-value of the mixture is 5.36 at 22.1° C. By addition of 27 drops of sulfuric acid (50%) the pH-value is set to 1.99 at 22.3° C. The catalyst composition absorption values at 870 nm in the UV-VIS spectra after several days of service lifetime are listed in table 1.

Example 10

In a 1000 mL beaker 500 mL of deionized water are provided. 23 mL of polystyrenesulfonic acid having an average molecular weight of approximately 1000 kDa (commercially available under the name Versa TL 501 by AkzoNobel AB), 23 mL of a poly(4-styrenesulfonic acid) sodium salt solution (30% by weight in $H_2O$, commercially available under the name Versa TL 77 by AkzoNobel AB) having an average molecular weight of 75 kDa and 15 mL of Envision® HDI Catalyst 7350A (containing 3,4-ethylenedioxythiophene and emulsifier) are added under stirring. The mixture is filled up to a volume of 1001 mL by 440 mL dionized water. The pH-value of the mixture is 5.27 at 21.9° C. By addition of 28 drops of sulfuric acid (50%) the pH-value is set to 1.98 at 21.9° C. The catalyst composition absorption values at 870 nm in the UV-VIS spectra after several days of service lifetime are listed in table 1.

Example 11

In a 1000 mL beaker 500 mL of deionized water are provided. 46 mL of Envision® HDI Catalyst 7350B (containing polystyrenesulfonic acid) and 15 mL of a aqueous solution comprising containing 10% by weight of 3,4-ethylenedioxythiophene and 12% weight of Soprophor 4D384 as emulsifier are added under stirring. The mixture is filled up to a volume of 1001 mL by 440 mL dionized water. The pH-value of the mixture is 2.13 at 21.2° C. The catalyst composition absorption values at 870 nm in the UV-VIS spectra after several days of service lifetime are listed in table 1.

Example 12

In a 1000 mL beaker 500 mL of deionized water are provided. 45 mL of Envision® HDI Catalyst 7350B (containing polystyrenesulfonic acid) and 15 mL of a aqueous solution comprising containing 10% by weight of 3,4-ethylene-dioxythiophene and 6% weight of Soprophor 4D384 and 6% weight of Soprophor TS 29 as emulsifiers are added under stirring. The pH-value of the mixture is 1.97 at 20.6° C. The catalyst composition absorption values at 870 nm in the UV-VIS spectra after several days of service lifetime are listed in table 1.

Example 13

In a 1000 mL beaker 500 mL of deionized water are provided. 45 mL of a 1:1 ratio mixture of polystyrenesulfonic acid having an average molecular weight of approximately 25 kDa (commercially available under the name Versa TL 4 by AkzoNobel AB) and maleic acid, and 15 mL of Envision® HDI Catalyst 7350A (containing 3,4-ethylenedioxythiophene and emulsifier) are added. The mixture is filled up to a volume of 1000 mL by 440 mL dionized water. The pH-value of the mixture is 9.11 at 20.6° C. By addition of 1.1 mL of sulfuric acid (50%) the pH-value is set to 2.07 at 20.7° C. The catalyst composition absorption values at 870 nm in the UV-VIS spectra after several days of service lifetime are listed in table 1.

TABLE 1

Absorption of the catalyst solutions at 870 nm

| days | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 |
|---|---|---|---|---|---|---|---|---|---|---|---|---|---|
| 1 | | 0.012 | | 0.034 | | 0.040 | 0.007 | 0.022 | 0.016 | 0.011 | | 0.026 | 0.006 |
| 2 | | 0.025 | 0.054 | 0.057 | | | | | | | | 0.056 | 0.013 |
| 3 | 0.196 | | | | 0.086 | | | | | | 0.054 | 0.085 | 0.017 |
| 4 | 0.311 | | | | 0.129 | 0.365 | 0.040 | 0.122 | 0.088 | 0.083 | 0.079 | 0.124 | 0.024 |
| 5 | | 0.089 | 0.075 | | | | 0.054 | 0.158 | 0.124 | 0.110 | 0.121 | | |
| 6 | | 0.121 | 0.094 | 0.203 | | | 0.075 | 0.200 | 0.164 | 0.146 | 0.181 | | |
| 7 | | 0.153 | 0.107 | 0.254 | | | 0.093 | 0.245 | 0.210 | 0.181 | 0.232 | 0.298 | 0.061 |
| 8 | 0.762 | 0.187 | 0.207 | 0.314 | 0.283 | | 0.112 | 0.296 | 0.260 | 0.230 | | 0.370 | 0.079 |
| 9 | 0.893 | | | 0.376 | 0.329 | | | | | | | 0.459 | 0.096 |
| 10 | 1.040 | | | | 0.383 | | | | | | | 0.558 | 0.121 |
| 11 | 1.208 | | | | 0.439 | | | | | | | 0.668 | 0.157 |
| 12 | | 0.319 | 0.193 | 0.573 | | | 0.228 | 0.504 | 0.470 | 0.442 | | | |
| 13 | | 0.349 | 0.204 | 0.655 | | | | | | | | | |
| 14 | 1.681 | 0.388 | 0.226 | 0.732 | 0.617 | | | | | | | 0.995 | 0.241 |
| 15 | 1.873 | 0.426 | 0.246 | 0.803 | 0.683 | | 0.343 | 0.691 | 0.676 | 0.624 | | | |
| 16 | 2.052 | 0.467 | 0.261 | | 0.748 | | | | | | | | |
| 17 | 2.223 | | | | 0.813 | | | | | | 1.172 | | |
| 18 | | | | | | | | | | | | | |
| 19 | | 0.571 | 0.314 | 1.098 | | | | | | | 1.449 | | |
| 20 | | | | 1.163 | | | | | | | | | |
| 21 | 2.888 | | | 1.241 | 1.057 | | | | | | | | |
| 22 | >3.000 | | | 1.320 | 1.119 | | | | | | | | |
| 23 | >3.000* | | | 1.402 | 1.184 | | | | | | | | |
| 24 | n.d. | | | | 1.258 | | | | | | | | |
| 25 | n.d. | | | | 1.320 | | | | | | | | |
| 26 | | | | 1.608 | | | | | | | | | |
| 27 | | | | | | | | | | | | | |
| 28 | n.d. | | | | 1.504 | | | | | | | | |

Example 14

Deionized water (500 mL) was introduced into a 1000 mL beaker. Then, with stirring, composition A, (15 mL) containing 3-4-ethylenedioxythiophene (3,4-EDT) and Soprophor TS29, and composition B (46 mL) comprising polystyrene sulfonic acid having a molecular weight of 75,000 Da and water, sold under the trade designation Versa TL 71, and deionized water (440 mL) were added to the water in the beaker. Stirring was continued until complete dissolution was observed.

Example 15

Deionized water (500 mL) was introduced into a 1000 mL beaker. Then, with stirring, 1-ethyl-3-methylimidazolium trifluoromethanesulfonate (EMI triflate; 10 g), composition A, (15 mL) containing 3-4-ethylenedioxythiophene (3,4-EDT) and Soprophor TS29, and composition B (45 mL) comprising polystyrene sulfonic acid having a molecular weight of 75,000 Da and water, sold under the trade designation Versa TL 71, and deionized water (440 mL) were added to the water in the beaker. Stirring was continued until complete dissolution was observed.

Example 16

Deionized water (500 mL) was introduced into a 1000 mL beaker. Then, with stirring, 1-hexyl-3-methylimidazolium (HMI) (trifluoromethylsulfonyl) imide (9.9 g), composition A, (16 mL) containing 3-4-ethylenedioxythiophene (3,4-EDT) and Soprophor TS29, and composition B (46 mL) comprising polystyrene sulfonic acid having a molecular weight of 75,000 Da and water, sold under the trade designation Versa TL 71, and deionized water (440 mL) were added to the water in the beaker. Stirring was continued until complete dissolution was observed. The solution remained cloudy and milky white.

Example 17

Deionized water (500 mL) was introduced into a 1000 mL beaker. Then, with stirring, lithium sulfate (2 g) manganese sulfate monohydrate (2 g), composition A, (15 mL) containing 3-4-ethylenedioxythiophene (3,4-EDT) and Soprophor TS29, and composition B (46 mL) comprising polystyrene sulfonic acid having a molecular weight of 75,000 Da and water, sold under the trade designation Versa TL 71, and deionized water (440 mL) were added to the water in the beaker. Stirring was continued until complete dissolution was observed.

Measurement of the Oligomers

At intervals of 2, 27, 86, 99 and 105 days after their preparation, the various catalyst solutions prepared according to Examples 14, 15 and 17 were subjected to UV-IS absorption analysis at 870 nm. The results are set forth in Table 2, below:

TABLE 2

| Lifetime in days | Example 14 | Example 17 | Example 15 |
| --- | --- | --- | --- |
| D2 | 0.064 | 0.062 | 0.025 |
| D27 | 2.947 | 0.670 | 0.317 |
| D86 | 1.653* | 0.385* | 2.319 |
| D99 | 1.892* | 0.453* | 2.875 |
| D105 | 2.035* | 0.514* | 0.329* |

Figure 2:
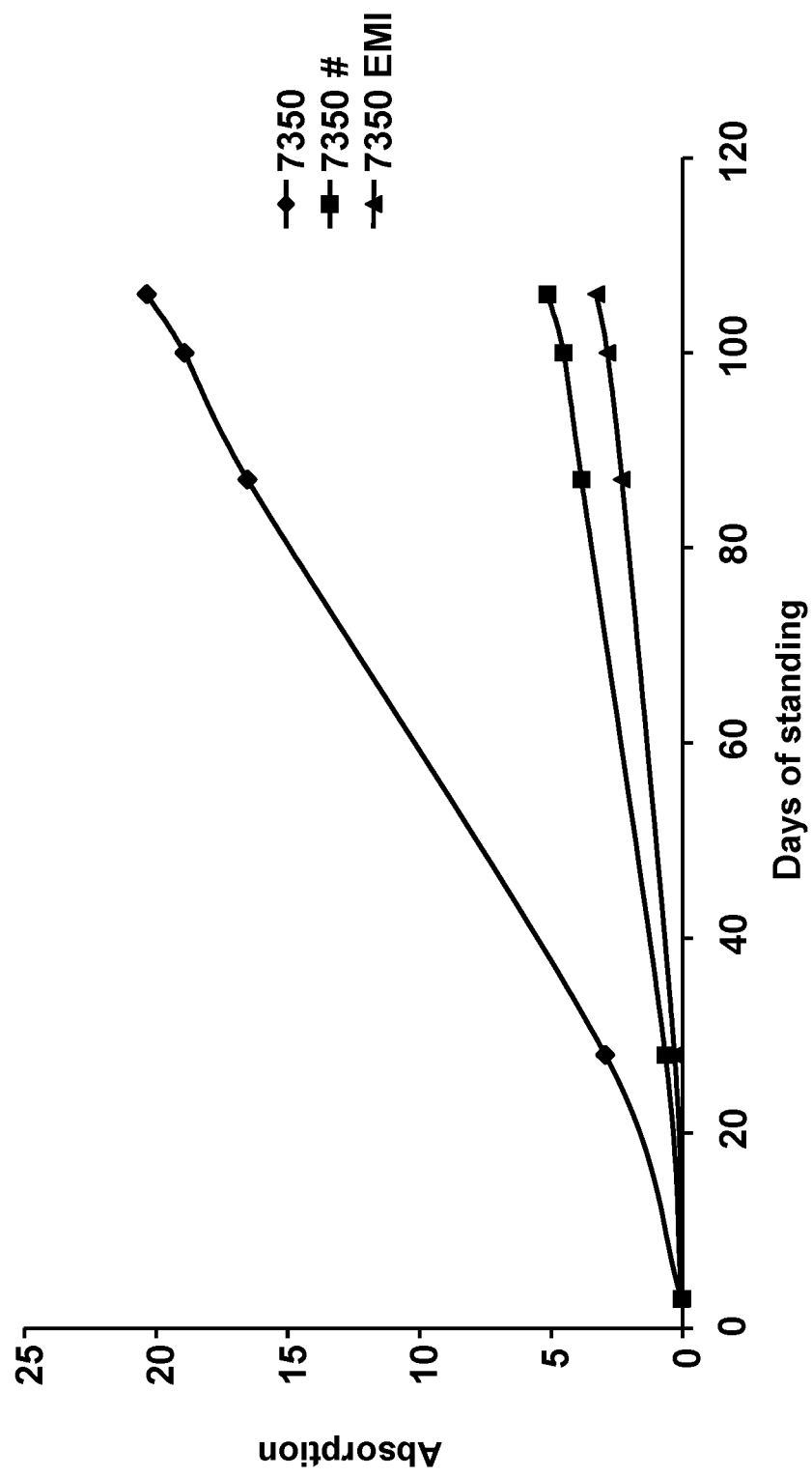
FIG. 2 is a plot of oligomer formation vs. aging of a monomer formulation of the invention, as measured by absorption of infrared radiation at 870 nm.

*Measurement is performed with 1:10 dilution, i.e. Cat 1 mL and 9 mL of deionized water The data in Table 2 are plotted in FIG. 2. From these data, the rate of increase in absorption vs. time was computed for each of Examples 14, 15, and 17. The rate of increase in absorption (slope) between successive measurements of absorption is set forth in Table 3.

TABLE 3

| Lifetime in days | Example 14 | Example 17 | Example 15 |
| --- | --- | --- | --- |
| 2 | 0.032 | 0.031 | 0.013 |
| 27 | 0.109 | 0.025 | 0.012 |
| 86 | 0.192 | 0.045 | 0.027 |
| 99 | 0.191 | 0.046 | 0.029 |
| 105 | 0.194 | 0.049 | 0.031 |

Linear Regression analysis can be applied to calculate the oligomer formation trend lines, which yields the following slopes and correlation coefficients:

TABLE 4

| Lifetime | Example 14 | Example 17 | Example 15 |
| --- | --- | --- | --- |
| Slope | 0.2045 | 0.0498 | 0.032 |
| $R^2$ | 0.9928 | 0.9871 | 0.9781 |

The computations show good agreement in the case of Examples 14 and 17. Only in the case of Example 15 is there appreciable deviation. In the latter case, the slope is not linear during the initial period but, from point where the absorbance reaches 0.2, the slope is greater. For the other two systems, the slope is substantially linear throughout, so that the correlation coefficient is very close to 1.0.

Deposition Rates after 105 Days

After 105 days, each of the monomer formulations of Example 14 to 17 were used in providing a conductive polymer layer on a dielectric substrate.

Thicknesses of copper deposited in the electrolytic plating step were measured in mm on the front and rear with a ruler at the edges and in the middle of each side. The three values of each side are added up and divided by 12. These two mean values are also summed and divided by two again. As a result, the deposition rate per minute, is given in mm/min.

During the polymerization, the average deposition rates were determined in mm per minute for each of Examples 14-17. The results are set forth below in Table 4 for polymerizations conducted after the monomer formulations (catalyst solutions) had aged for 105 days.

TABLE 5

| Days | Example 14 [mm/min] | Example 17 [mm/min] | Example 15 [mm/min] | Example 16 [mm/min] |
| --- | --- | --- | --- | --- |
| D105 | 0.3 | 2.3 | 1.5 | 2.3 |

After 105 days aging, only the catalyst composition of Example 14 provided an insufficient rate of deposition. All others are at least marginally acceptable.

IS 410 Conductivity Measurement Result

In addition to the deposition rate, the conductivity of the poly(3,4-ethylenedioxythiophene) polymer deposit for each of Examples 14-17 was determined by the four-point method. The results are set forth in the tables below

| Example 14 | Voltage [V] | Current [μA] | Resistance [Ω] | Deposition rate [mm/min] |
| --- | --- | --- | --- | --- |
| VS left | −0.11 | 0 | | 0.3 |
| VS middle | −0.15 | 0 | | 0.3 |
| VS right | −0.09 | 0 | | 0.3 |
| RS left | −0.05 | 0 | | 0.3 |
| RS middle | −0.04 | 0 | | 0.3 |
| RS right | −0.01 | 0 | | 0.3 |

The resistance is well above Ω of 1000000.

| Example 17 | Voltage [V] | Current [mA] | Resistance [Ω] | Deposition rate [mm/min] |
| --- | --- | --- | --- | --- |
| VS left | −1.05 | 0.030 | 35000 | 2.3 |
| VS middle | −0.98 | 0.032 | 30630 | 2.3 |
| VS right | −1.13 | 0.033 | 34250 | 2.3 |
| RS left | −0.77 | 0.0187 | 41180 | 2.3 |
| RS middle | −0.74 | 0.0217 | 34110 | 2.3 |
| RS right | −0.74 | 0.0215 | 34420 | 2.3 |

On the front it has a mean of 33 300Ω resistance. On the back are the average 36 570Ω resistance.

| Example 15 | Voltage [V] | Current [mA] | Resistance [Ω] | Deposition rate [mm/min] |
| --- | --- | --- | --- | --- |
| VS left | −0.99 | 0.0172 | 57560 | 1.6 |
| VS middle | −1.07 | 0.0228 | 46930 | 1.6 |
| VS right | −1.30 | 0.0253 | 51390 | 1.6 |

| Example 15 | Voltage [V] | Current [mA] | Resistance [Ω] | Deposition rate [mm/min] |
|---|---|---|---|---|
| RS left | −0.88 | 0.0173 | 50870 | 1.3 |
| RS middle | −0.90 | 0.0168 | 53580 | 1.3 |
| RS right | −0.58 | 0.0111 | 52260 | 1.3 |

On the front it has a mean of 51 960Ω resistance. On the back are the average 52 240Ω resistance. The resistance is about twice as high as Example 17.

| Example 16 | Voltage [V] | Current [mA] | Resistance [Ω] | Deposition rate [mm/min] |
|---|---|---|---|---|
| VS left | −1.02 | 0.1114 | 9160 | 2.5 |
| VS middle | −0.92 | 0.1054 | 8730 | 2.5 |
| VS right | −1.00 | 0.0982 | 10190 | 2.5 |
| RS left | −0.95 | 0.0787 | 12080 | 2.1 |
| RS middle | −0.90 | 0.0912 | 9870 | 2.1 |
| RS right | −0.68 | 0.0733 | 9280 | 2.1 |

On the front the mean resistance was 9360Ω. On the back are the average was 10 410Ω, significantly lower than for all other experiments. Nevertheless, the deposition rate was not significantly better. This is also confirmed in previous experiments.

Examples 18-20

Conductive polymer coatings were provided on a dielectric substrate according to the method described respectively in Examples 14-17.
Result IS EN 156 ML Deposition
After 105 days, each of the monomer formulations of Examples 18-21 was used in providing a conductive polymer layer on a dielectric substrate.
Deposition rates expressed in mm/min were measured as follows.
Thicknesses of copper deposited in the electrolytic plating step were measured in mm on the front and rear with a ruler at the edges and in the middle of each side. The three values of each side are added up and divided by 12. These two mean values are also summed and divided by two again. As a result, the deposition rate per minute, is given in mm/min.
During the polymerization, the average deposition rates were determined in mm per minute for each of Examples 18-21. The results are set forth below in Table 4 for polymerizations conducted after the monomer formulations (catalyst solutions) had aged for 105 days.
The following average deposition rates were determined, as expressed in mm per minute.

| Days | Example 18 [mm/min] | Example 21 [mm/min] | Example 19 [mm/min] | Example 20 [mm/min] |
|---|---|---|---|---|
| D105 | 0.4 | 2.0 | 1.0 | 2.1 |

After 105 days as time, an insufficient deposition rate was experienced only in Example 18 in which polymerization was conducted in the absence of a metallic or nitrogenous ion of the type described hereinabove. Deposition rates for Examples 19-21 were all at least marginally acceptable.
Result IS EN 156 ML Conductivity Measurement
In addition to the deposition, the conductivity is determined by the four-point method.

| Exp. 18 | Voltage [V] | Current [μA] | Resistance [Ω] | Deposition rate [mm/min] |
|---|---|---|---|---|
| VS left | −0.45 | 0.1 | 4500000 | 0.4 |
| VS middle | −0.02 | 0 | | 0.4 |
| VS right | −0 | 0 | | 0.4 |
| RS left | −2.36 | 0.4 | 5900000 | 0.3 |
| RS middle | −1.16 | 0.2 | 5800000 | 0.3 |
| RS right | −0.23 | 0.1 | 2300000 | 0.3 |

The resistance is well above Ω of 1000000.

| Exp. 21 | Voltage [V] | Current [mA] | Reistance [Ω] | Deposition rate [mm/min] |
|---|---|---|---|---|
| VS left | −1.26 | 0.0534 | 23600 | 2.0 |
| VS middle | −1.52 | 0.0658 | 23100 | 2.0 |
| VS right | −1.34 | 0.0527 | 25430 | 2.0 |
| RS left | −1.30 | 0.1157 | 11240 | 1.9 |
| RS middle | −1.44 | 0.1426 | 10100 | 1.9 |
| RS right | −1.32 | 0.1127 | 11720 | 1.9 |

On the front it has a mean of 24 050Ω resistance. On the back are the average 11 020Ω resistance. The resistance on the back is half as high as on the front. Also, the resistance is much lower than in Example 18.

| Exp. 19 | Voltage [V] | Current [mA] | Resistance [Ω] | Deposition rate [mm/min] |
|---|---|---|---|---|
| VS left | −1.16 | 0.0556 | 20870 | 1.0 |
| VS middle | −1.22 | 0.0724 | 16850 | 1.0 |
| VS right | −1.23 | 0.0681 | 18070 | 1.0 |
| RS left | −1.09 | 0.0612 | 17810 | 1.0 |
| RS middle | −1.10 | 0.0678 | 16230 | 1.0 |
| RS right | −1.24 | 0.0623 | 19910 | 1.0 |

On the front it has a mean of 18 600Ω resistance. On the back are the average 17 990Ω resistance. The resistance is similar to Example 21 but the deposition rate is significantly lower.

| Exp. 20 | Voltage [V] | Current [mA] | Resistance [Ω] | Deposition rate [mm/min] |
|---|---|---|---|---|
| VS left | −1.09 | 1.002 | 1090 | 2.0 |
| VS middle | −1.06 | 1.278 | 830 | 2.0 |
| VS right | −1.04 | 1.120 | 930 | 2.0 |
| RS left | −0.64 | 0.712 | 900 | 2.1 |
| RS middle | −0.67 | 0.826 | 820 | 2.1 |
| RS right | −0.81 | 0.818 | 990 | 2.1 |

On the front the mean resistance was 950Ω. On the back are the mean resistance was 910Ω. Again, the resistance is by far the lowest, but the deposition rate is comparable to Example 21 which has a resistance of about 18000Ω.

Example 21

Figure 3:
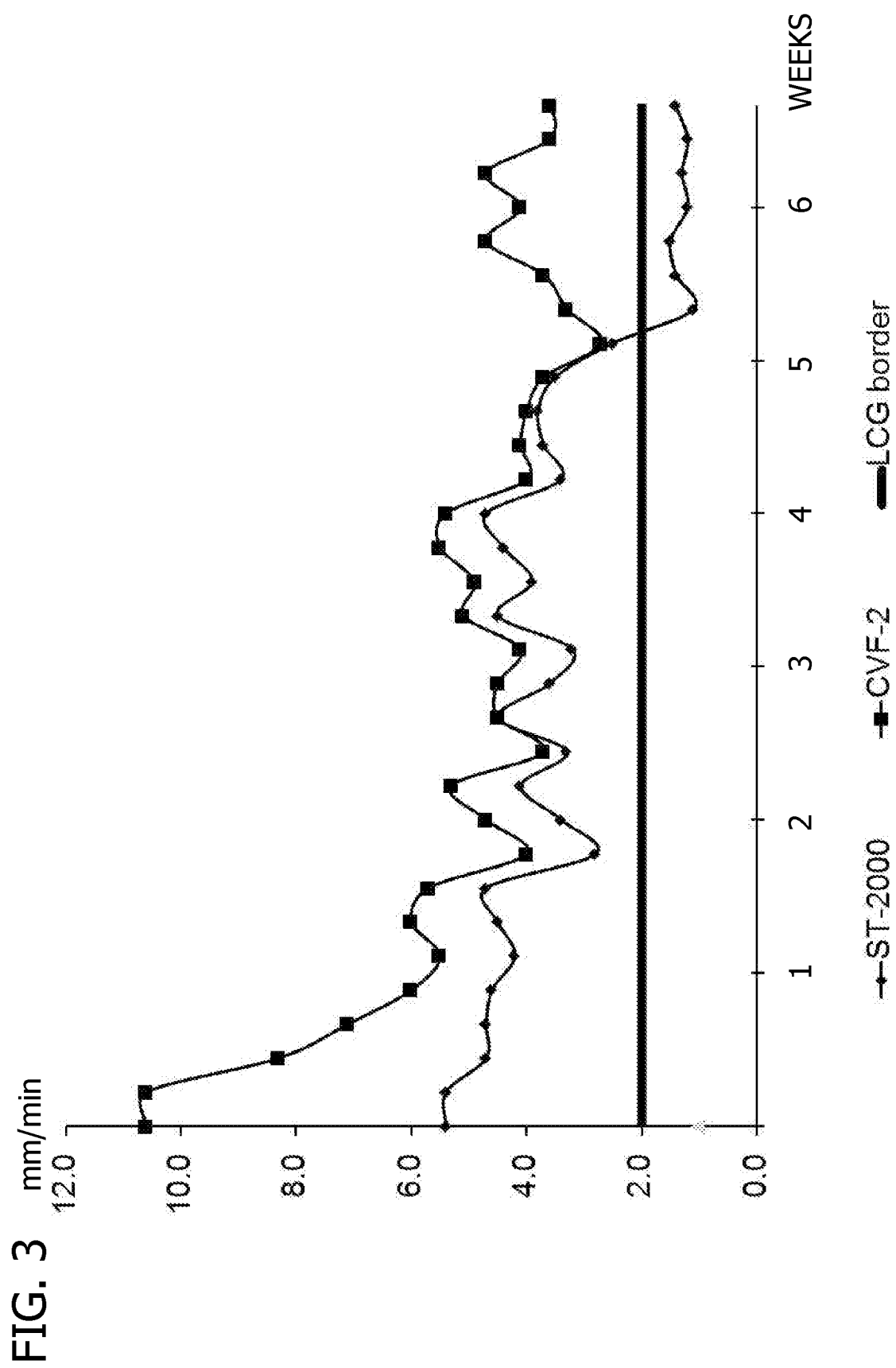
FIGS. 3-6 show lateral copper growth (LCG) rate testing as described in Example 21.
Figure 4:
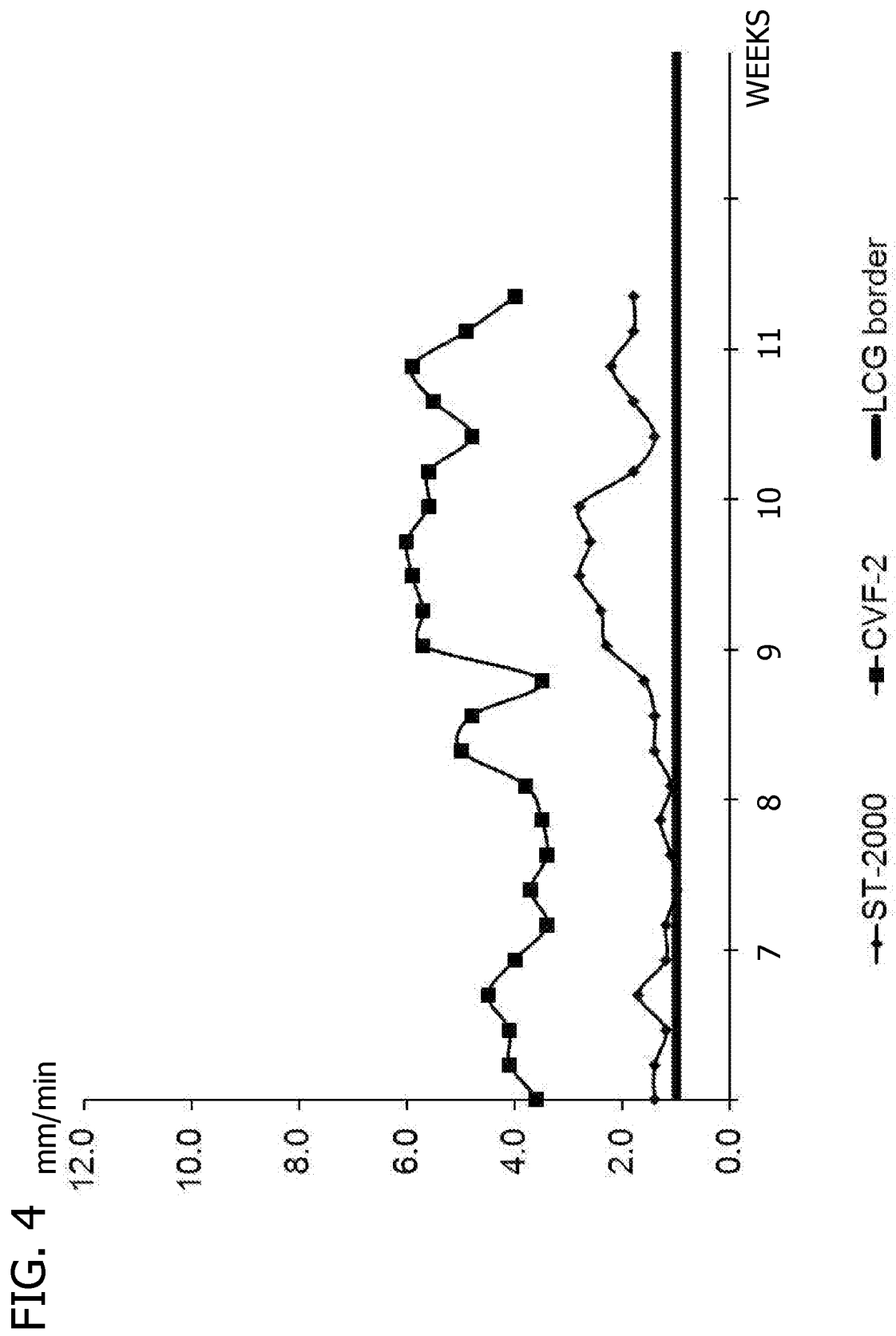

FIGS. 3 through 6 provide results of lateral copper growth (LCG) rate testing for two catalyst compositions, one employing a relatively lower molecular weight acid and the other employing a relatively higher molecular weight acid. Substrates treated with these catalyst compositions where then analyzed for their performance in Cu electrodeposition using both high-Cu electrolytes and the low-Cu electrolytes currently preferred for many PWB applications.
FIGS. 3 and 4 provide LCG rate results (mm/min) over the course of approximately 11 weeks for a catalyst composition containing EDT monomer (approximately 2 g/L) and approximately 2 g/L of polystyrene sulfonic acid having a molecular weight of approximately 75,000 Da ("low molecular weight acid composition"). Substrates treated with the catalyst composition were then subjected to copper plating using one of two copper plating baths. One copper plating bath was a "low-Cu" composition (ST-2000) containing approximately 15-20 g/L Cu ions. The other copper plating bath was a "high Cu" composition (CVF-2) containing approximately 50-60 g/L copper ions.

The catalyst composition was applied to the substrate prior to placing the substrate in the copper plating bath (ST-2000 or CVF-2).

Figure 5:
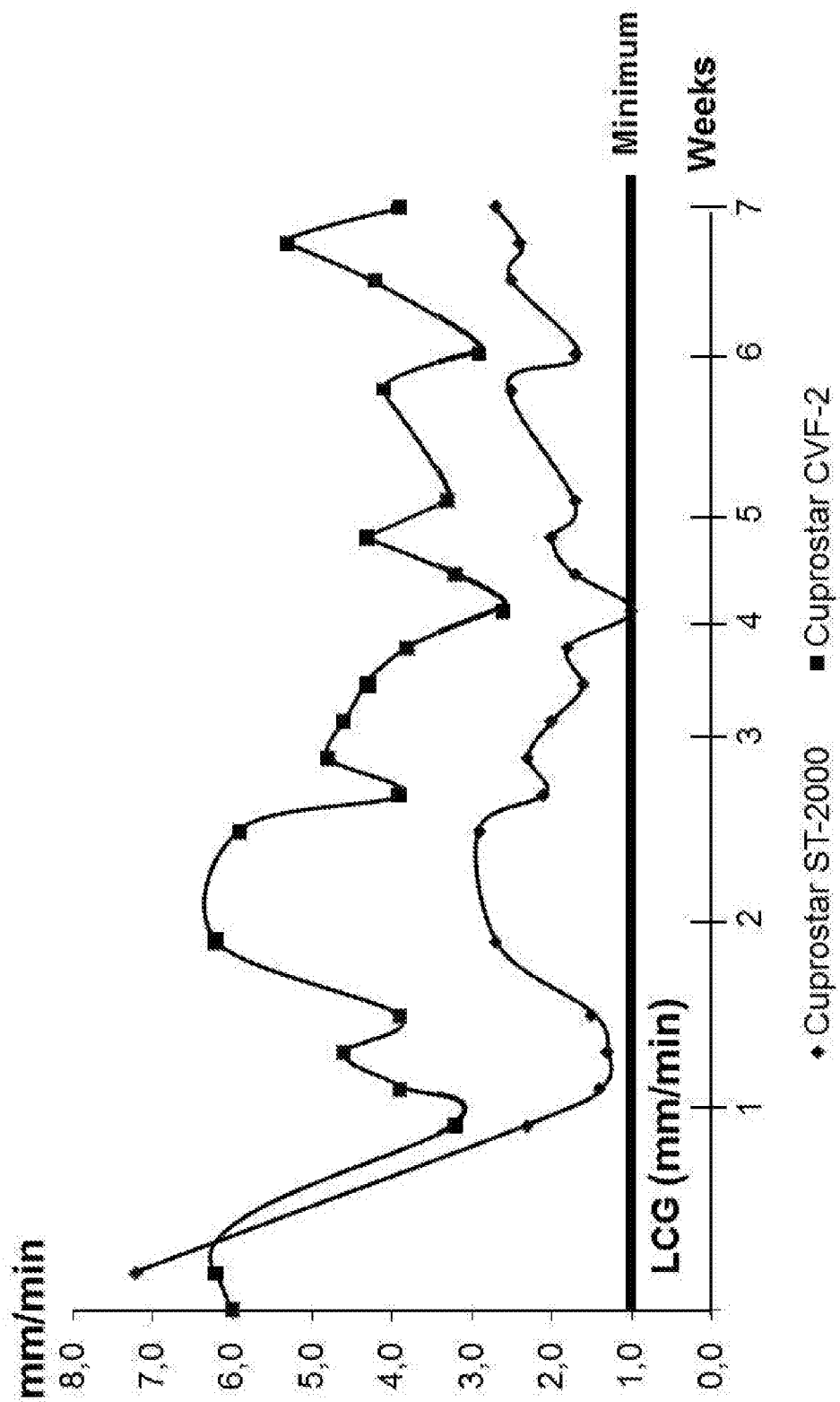
Figure 6:
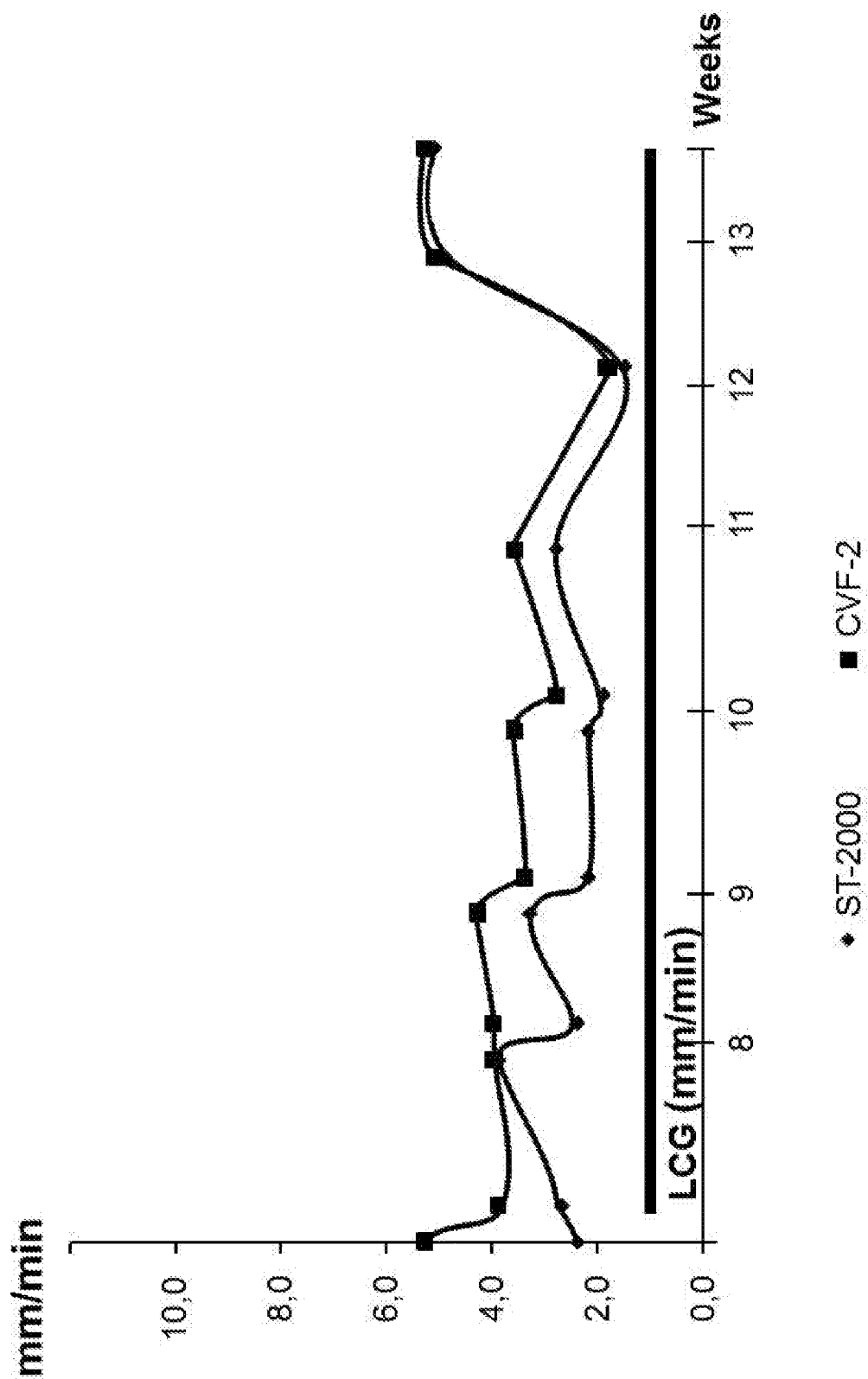

FIGS. 5 and 6 provide LCG rate results (mm/min) over the course of approximately 14 weeks for a catalyst composition containing EDT monomer (approximately 2 g/L) and 2 g/L polystyrene sulfonic acid having a molecular weight of approximately 1,000,000 Da ("high molecular weight acid composition"). Substrates treated with this high MW acid catalyst composition were then subsequently subjected to copper plating in either a "low-Cu" composition (ST-2000) containing approximately 15-20 g/L Cu ions or the "high Cu" composition (CVF-2) containing approximately 50-60 g/L copper ions.

FIGS. 5 and 6 show that for electrolytic copper plating onto the substrates treated with the high MW acid catalyst composition, the LCG rate remained above a commercially acceptable minimum of 1 mm/min for 14 weeks. Moreover, the gap between LCG rates in the high Cu and low Cu electrolytes was, generally speaking, less than about 1.5 mm and was especially small in the latter weeks. FIGS. 3 and 4, in contrast, show that for electrolytic copper plating onto the substrates treated with the low MW acid catalyst, the LCG rate in the low Cu electrolyte plummeted at about five weeks, and there was, generally speaking, a larger difference (e.g., >2 or 3 mm/min gap) in LCG rates in the latter weeks. These tests therefore show that the high MW acid catalyst compositions of the invention are advantageous for preparing substrates for both high Cu electrolytes and the low Cu electrolytes preferred in many PWB plating operations.

The LCG border of FIGS. 4-6 is 1 mm/min, compared to an LCG border of 2 mm/min in FIG. 3. This change accounts for the fact that the substrate used in the testing shown in FIGS. 4-6 has a higher glass transition temperature (TG) and a normally lower LCG than the substrate used in the testing shown in FIG. 3.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense. The scope of invention is defined by the appended claims and modifications to the embodiments above may be made that do not depart from the scope of the invention.

The invention claimed is:

1. A composition for the formation of electrically conductive polymers on the surface of a dielectric substrate, the composition comprising:
at least one polymerizable monomer which is capable of forming a conductive polymer,
an emulsifier, and
an acid,
wherein the composition comprises at least one metallic or nitrogenous ion selected from the group consisting of lithium-ions, sodium-ions, aluminum-ions, beryllium-ions, bismuth-ions, $B_xO_y$-anions, indium-ions, and alkylimidazolium-ion, and
wherein the acid is a polymeric acid having a molecular weight of at least 500,000 Da.

2. The composition according to claim 1 wherein the polymeric acid has a molecular weight of at least about 600,000 Da.

3. The composition according to claim 1 wherein the polymeric acid has a molecular weight of between about 500,000 Da and about 1,500,000 Da.

4. The composition according to claim 1, wherein the acid comprises at least one acid and/or a salt of an acid selected from the group consisting of sulfuric acid, sulfonic acid, alley sulfonic acid, polymeric sulfonic acid, polystyrene sulfonic acid, polyphosphoric acid, isethionic acid, sulfosuccinic acid, aryl sulfonic acid, p-toluene sulfonic acid.

5. The composition according to claim 4 wherein the acid comprises a polymeric sulfonic acid.

6. The composition according to claim 5 wherein the polymeric sulfonic acid comprises a poly(vinylaryl)sulfonic acid.

7. The composition according to claim 6 wherein the acid is polystrene sulfonic acid.

8. The composition according to claim 7 wherein polystyrene sulfonic acid is incorporated into the composition in the form of the sodium salt.

9. The composition according to claim 8 wherein the sodium salt of polystyrene sulfonic acid provides substantially all of the at least one metallic or nitrogenous ion of the composition.

10. The composition according to claim 1, wherein the metallic or nitrogenous ion is selected from the group consisting of lithium-ions and sodium-ions, in a concentration between 0.001 mol/L and the solubility limit.

11. The composition according to claim 1, wherein the polymerizable monomer is a heterocyclic aromatic molecule having the structure:

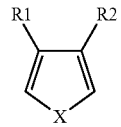

wherein: X is O, S, or N; and R1 and R2 are each independently hydrogen, a halogen, a substituted or unsubstituted alky group having from 1 to 8 carbon atoms, a substituted or unsubstituted alkoxy group having 1 to 8 carbon atoms.

12. The composition according to claim 1, wherein the concentration of the emulsifier in the composition is in a range between 0.1 mL/L to 200 mL/L.

13. The composition according to claim 1, further comprising at least one solvent selected from the group consisting of water, methanol, ethanol, n-propanol, isopropanol, higher alcohols, polyalcohols, dimethyl formamide, methylethylketone, cumene sulfonate, N-methyl pyrrolidone, Triglyme, Diglyme, and alkali metal salts of toluene sulfonates or their ethyl esters.

14. The composition according to claim 1, further comprising a source of cations for the electrolytic deposition of a metal.

15. The composition according to claim 1, wherein the emulsifier is a nonionic surfactant.

16. The composition according to claim 15 wherein the nonionic surfactant is an alkoxylated aralkylphenol.

17. The composition according to claim 16 wherein the nonionic surfactant is an ethoxylated tristyrylphenol.

18. The composition according to claim 1, wherein the emulsifier is an anionic polyarylphenolalcoxylate or a salt of a polyarylphenolalcoxylate.

19. The composition according to claim 1, wherein the emulsifier is selected from the group consisting of a salt of a sulfoalkylated polyalkoxylated naphthol or an aralkyl substituted sulfo polyalkoxylated phenol.

20. The composition as set forth in claim 19 wherein the emulsifier is a compound having a molecular structure according to the following formula:

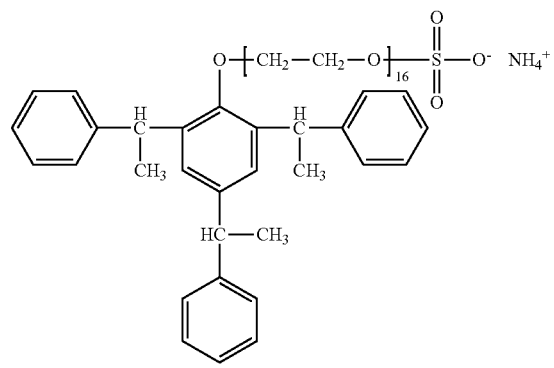

poly(oxy-1,2-ethanediyl)alpha.-sulfo-.omega.-[bis(1-phenylethyl)phenoxy]-ammonium salt.

21. A composition as set forth in claim 1, comprising an emulsifier corresponding to the structural formula:

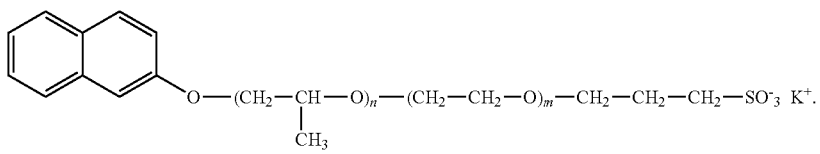

22. A composition as set forth in claim 1, further comprising manganese ions.

23. A method for metalizing a surface of a dielectric substrate by deposition of a metal, the method comprising: immersing the substrate into a composition comprising:
at least one polymerizable monomer which is capable of forming a conductive polymer,
an emulsifier, and
an acid,
wherein the composition comprises at least one metallic or nitrogenous ion selected from the group consisting of lithium-ions, sodium-ions, aluminum-ions, beryllium-ions, bismuth-ions, $B_xO_y$-anions, indium-ions, and alkylimidazolium-ion, and
wherein the acid is a polymeric acid having a molecular weight of at least 500,000 Da,
to form an electrically conductive polymer on the surface of the dielectric substrate; and
depositing a metal over said electrically conductive polymer.

* * * * *